(12) United States Patent
Lukyanov et al.

(10) Patent No.: US 11,870,507 B2
(45) Date of Patent: Jan. 9, 2024

(54) WIRELESS BOARD-TO-BOARD INTERCONNECT FOR HIGH-RATE WIRELESS DATA TRANSMISSION

(71) Applicant: SAMSUNG ELECTRONICS CO., LTD., Suwon-si (KR)

(72) Inventors: Anton Sergeevich Lukyanov, Moscow (RU); Mikhail Nikolaevich Makurin, Moscow (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 17/235,278

(22) Filed: Apr. 20, 2021

(65) Prior Publication Data

US 2022/0131571 A1 Apr. 28, 2022

(30) Foreign Application Priority Data

Oct. 23, 2020 (RU) ............................... 2020134900
Mar. 3, 2021 (KR) ...................... 10-2021-0028200

(51) Int. Cl.
*H04B 5/00* (2006.01)
*H01P 3/12* (2006.01)
(Continued)

(52) U.S. Cl.
CPC ........... *H04B 5/0012* (2013.01); *H01P 3/121* (2013.01); *H01Q 1/2283* (2013.01); *H01Q 9/16* (2013.01);
(Continued)

(58) Field of Classification Search
CPC ...... H04B 5/00; H04B 5/0012; H04B 5/0025; H04B 5/0031; H01P 3/12; H01P 3/121;
(Continued)

(56) References Cited

U.S. PATENT DOCUMENTS

| 8,041,227 B2 | 10/2011 | Holcombe et al. |
| 8,779,874 B2 * | 7/2014 | Toyao ..................... H01P 3/081 333/204 |

(Continued)

FOREIGN PATENT DOCUMENTS

| CN | 110364799 | 10/2019 |
| CN | 111244587 | 6/2020 |

(Continued)

OTHER PUBLICATIONS

Parment, "High performance multilayer Substrate Integrated Waveguide (SIW) technics for low-cost millimeter-wave circuits", HAL, Universite Grenoble Alpes 2016, 196 pages.

(Continued)

*Primary Examiner* — Quochien B Vuong
(74) *Attorney, Agent, or Firm* — Nixon & Vanderhye, P.C.

(57) ABSTRACT

Provided is a device for transmitting signals, the device including: a first conductive base and a second conductive base parallel to each other, a waveguide at least partially surrounded by side walls located between the first conductive base and the second conductive base and including at least one electromagnetic band gap (EBG) structure, and at least two directional antennas opposite to or facing each other in a direction in which signals are transmitted, wherein each antenna is on a printed circuit board and includes another EBG structure located on an upper layer and a lower layer of the printed circuit board and at least one matching element, at least a part of each of the antennas is located inside the waveguide to form a wireless channel configured to transmit electromagnetic signals in an area between the antennas, and the at least one matching element is located within a specified distance of the wireless channel and is configured to match the antenna with the wireless channel.

20 Claims, 24 Drawing Sheets

(51) Int. Cl.
*H01Q 1/22* (2006.01)
*H05K 1/14* (2006.01)
*H05K 1/02* (2006.01)
*H01Q 9/16* (2006.01)

(52) U.S. Cl.
CPC .......... *H05K 1/0236* (2013.01); *H05K 1/142* (2013.01); *H05K 1/144* (2013.01); *H05K 2201/10098* (2013.01)

(58) Field of Classification Search
CPC .......... H01Q 1/22; H01Q 1/2283; H01Q 9/16; H05K 1/0213; H05K 1/023; H05K 1/0236; H05K 1/14; H05K 1/142
See application file for complete search history.

(56) References Cited

U.S. PATENT DOCUMENTS

| | | | | |
|---|---|---|---|---|
| 8,803,638 | B2* | 8/2014 | Kildal | H01P 3/123 333/248 |
| 10,249,953 | B2* | 4/2019 | Ng | H01Q 1/286 |
| 10,305,174 | B2* | 5/2019 | Ryan | H01Q 1/273 |
| 10,454,184 | B2* | 10/2019 | Boutayeb | H01Q 21/24 |
| 10,680,324 | B2* | 6/2020 | Weinstein | H01Q 1/2283 |
| 2007/0285336 | A1 | 12/2007 | Kamgaing | |
| 2009/0289869 | A1 | 11/2009 | Babakhani et al. | |
| 2014/0287702 | A1 | 9/2014 | Schuppener et al. | |
| 2016/0344093 | A1 | 11/2016 | Tagi et al. | |
| 2017/0250726 | A1 | 8/2017 | Gundel et al. | |
| 2018/0108964 | A1 | 4/2018 | Adas et al. | |
| 2018/0277946 | A1 | 9/2018 | Murata et al. | |
| 2019/0057945 | A1 | 2/2019 | Maaskant et al. | |
| 2019/0319341 | A1 | 10/2019 | Park et al. | |
| 2019/0379426 | A1 | 12/2019 | McCormack | |
| 2020/0076072 | A1 | 3/2020 | Keyrouz et al. | |
| 2020/0168974 | A1 | 5/2020 | Vosoogh | |
| 2020/0185802 | A1 | 6/2020 | Vilenskiy et al. | |

FOREIGN PATENT DOCUMENTS

| | | |
|---|---|---|
| KR | 10-2019-0119954 | 10/2019 |
| KR | 10-2020-0070120 | 6/2020 |
| KR | 10-2020-0082417 | 7/2020 |
| RU | 2696676 | 8/2019 |
| RU | 2703604 | 10/2019 |
| WO | 2018/209422 | 11/2018 |

OTHER PUBLICATIONS

Bayat-Makou et al., Contactless Air-Filled Substrate Integrated Waveguide, IEEE Transactions on Microwave Theory and Techniques (vol. 66, Issue), IEEE Transactions on Microwave Theory and Techniques, 2018, pp. 1-8.

Nguyen et al., "Dielectric Slab Air-Filled Substrate Integrated Waveguide (SAFSIW) Bandpass Filters", IEEE Microwave and Wireless Components Letters, vol. 30, No. 4, Apr. 2020, pp. 363-366.

Office Action for RU2020134900 dated Feb. 24, 2021, 9 pages.

NOA for RU2020134900 dated Oct. 23, 2020, 2 pages.

International Search Report and Written Opinion dated Aug. 3, 2021 in corresponding International Application No. PCT/KR2021/004916.

* cited by examiner

WIRELESS BOARD-TO-BOARD INTERCONNECT FOR HIGH-RATE WIRELESS DATA TRANSMISSION

CROSS-REFERENCE TO RELATED APPLICATIONS

This application is based on and claims priority under 35 U.S.C. § 119 to Russian Patent Application No. 2020134900, filed on Oct. 23, 2020, in the Russian Patent Office, and Korean Patent Application No. 10-2021-0028200, filed on Mar. 3, 2021, in the Korean Intellectual Property Office, the disclosures of which are incorporated by reference herein in their entireties.

BACKGROUND

Field

The disclosure relates to radio engineering, and, for example, to high-rate wireless data transmission between different printed circuit boards or between portions of the same printed circuit board.

Description of Related Art

Constantly increasing demands of users motivate rapid development of technologies in the field of communications and in related fields. Currently, under active development there are systems using communication in the millimeter-wave band, such as data transmission systems 5G (28 GHz), WiGig (60 GHz), Beyond 50 (60 GHz), 6G (subTHz). All these and similar systems need highly efficient, functional and at the same time simple and reliable components suitable for mass production.

One of such components may include a connection (or connector) for transmitting data over a short distance between different printed circuit boards (PCBs) or between different portions of the same printed circuit board. Key requirements imposed on such connections include the following: a connection should preferably be wireless, should have low losses and compact feeding system, cheap, compact, repeatable hardware design applicable for mass-production; preferably, a connection should not be a separate component, but be a part of PCB or an integrated antenna; at the same time, stable reception should be supported at a high data transmit rate (>2 Gbps); it is preferable also to support high-performance antennas based on multi-layer printed circuit boards. However, solutions existing in the prior art, when trying to adapt them to the millimeter-wave band, are unsuitable to meet many of the above requirements, because they are either too expensive, or too bulky, or require isolation, or require precise mechanical assembling or manufacturing, or do not provide the specified data transmission rate.

In particular, the known electrical methods of board-to-board connection for data transmission over a short distance may be roughly divided into two groups: wired connection (conventional galvanic connection using metal conductors) and wireless connection, which, in turn, may be divided into two subgroups: a connection based on radio communication and a connection based on optical communication.

As an example of a galvanic connection, surface mount (SMD) connectors are known whose components are mounted or positioned directly on the surface of a printed circuit board. As another example, radio frequency (RF) connectors are known, which are mounted on the surface of a printed circuit board and provide a connection between the printed circuit boards. Such methods of connecting printed circuit boards require a galvanic contact to provide a transition in the RF channel. These approaches have problems associated with, for example, low transmission frequency: SMD connectors operate at frequencies up to 20 GHz, and RF connectors at up to 65 GHz. They are very sensitive to mechanical and thermal loads, as well as to assembly and soldering misalignments, which leads to low reliability of contacts, to a change in the parameters of the HF transition, to an increase in losses and, ultimately, to early failure of contacts. Therefore, they require spending large time for assembling and mounting, and maintaining a minimum distance between circuit boards >8 mm.

As an example of a wireless communication based on radio communication, data transmission using near field communication (NFC) is known. Existing NFC technologies have problems with magnetic field shielding, which require using of a ferrite shield and increasing an occupied space. Such solutions have a narrow bandwidth and low data transmission rate (up to 2.1 Mbps), since the carrier frequency of this technology is 13.56 MHz.

With regard to wireless communication based on optical communication, existing optical technologies have inherent problems with the need for a direct view between a transmitter and a receiver, as well as with beam control, which is necessary because the receiver size is small as compared to the device size. This requires the use of sophisticated precision mechanics and tuning, which increases an occupied space, causes changes or distortion of the optical communication parameters, and/or increases losses.

US 2019/0379426 A1 (Dec. 12, 2019) discloses a transmitter and a receiver disposed on separate substrates, or carriers, that are positioned relative to each other such that, in operation, the antennas of the transmitter/receiver pair are separated by a distance such that, at wavelengths of the transmitter carrier frequency, near-field coupling is obtained. This does not solve the problem of co-integration of a radio frequency integrated circuit (RFIC) and the antenna, because the antenna elements integrated into the RFIC are located on separate boards.

US 2017/0250726 A1 (Aug. 31, 2017) discloses a wireless connector that includes a first communication device and a second communication device. The first communication device is configured to wirelessly transmit, by radiative coupling, a modulated signal comprising a carrier signal modulated with a digital signal. The second communication device is configured to receive the modulated signal. The first and second communication devices are coupled through at least one wired connection that carries a signal used to demodulate the modulated signal. This solution requires at least one galvanic connection for demodulation.

U.S. Pat. No. 8,041,227 B1 (Oct. 18, 2011) discloses a communication device having optical and near-field communication capability. The device includes an optical transceiver circuit fabricated on an integrated circuit die and configured to transmit and receive far field signals. A near field transceiver circuit is also fabricated on the integrated circuit die and is configured to transmit and receive near-field electro-magnetic signals. Control circuitry is also provided to cause the optical transceiver circuit and the near field transceiver circuit to selectively respond to an external control signal. The infrared data transmission proposed in this solution does not have a high rate, and in addition, an additional channel is required for pairing.

US 2009/0289869 A1 (Nov. 26, 2009) discloses an antenna structure for coupling electromagnetic energy between a chip and an off-chip element, including a first resonant structure disposed on or in a chip. The first resonant structure is configured to have a first resonant frequency. The antenna structure also includes a second resonant structure disposed on or in an off-chip element. The second resonant structure is configured to have a second resonant frequency substantially the same as the first resonant frequency. The first resonant structure and the second resonant structure are mutually disposed within a near field distance of each other to form a coupled antenna structure that is configured to couple electromagnetic energy between the chip and the off-chip element. The electromagnetic energy has a selected wavelength in a wavelength range from microwave to sub-millimeter waves. This solution is narrowband and does not support millimeter waves and subTHz (sub-terahertz) range.

Another known publication in this area is N. Bayat-Makou, A. Kishk. Bayat-Makou, A. Kishk. Contactless Air-Filled Substrate Integrated Waveguide, IEEE Transactions on Theory and Techniques (Volume: 66, Issue: June 2018). This paper first introduced a contactless alternative to an air-filled SIW waveguide (AF-SIW). The conventional AF-SIW configuration requires an accurate and flawless connection of the coating layers to the intermediate substrate. For efficient operation at high frequencies, this requires a complex and expensive manufacturing process. In this configuration (FIGS. 1A, 1B, and 1C) the waveguide is a top and bottom conductive layers, between which there is an air-filling medium, and on the sides of the waveguide are arranged printed circuit boards. The top and bottom layers of these embedded printed circuit boards are modified to obtain artificial magnetic conductor (AMC) conditions. The AMC surfaces on both sides of the waveguide substrate are made as a periodic structure with a special type of unit cells. The AMC plates lying in the substrate region parallel to the conductive layers prevent leakage beyond the waveguide. However, this structure shows relatively high losses at the required frequencies and needs to be improved.

Thus, there is a need in the prior art to create a connection that would address the following disadvantages of the existing approaches:
high losses;
low data transmit rate;
big sizes;
high manufacturing complexity;
strong dependence on the quality of the contact between conductive elements.

SUMMARY

Embodiments of the disclosure address some of the aforementioned disadvantages of the prior art, by providing a device for transmitting data based on the printed circuit board for use in the millimeter-wave band.

According to various example embodiments, a device for transmitting signals includes: a first conductive base and a second conductive base parallel to each other, a waveguide at least partially surrounded by side walls located between the first conductive base and the second conductive base and comprising at least one electromagnetic band gap (EBG) structure, and at least two directional antennas opposite to or facing each other in a direction in which signals are transmitted.

Each antenna is based on a printed circuit board and comprises another EBG structure located on an upper layer and a lower layer of the printed circuit board and at least one matching element, at least a part of each of the antennas is located inside the waveguide to form a wireless channel for transmitting electromagnetic signals in an area between the antennas, and the at least one matching element is located near the wireless channel and is configured to match the antenna with the wireless channel.

According to various example embodiments, a device for transmitting signals includes: a first conductive plate and a second conductive plate parallel to each other, side walls located between the first conductive base and the second conductive base and comprising at least one electromagnetic band gap (EBG) structure, a waveguide at least partially surrounded by the first conductive plate, the second conductive plate, and the side walls, and a pair of directional antennas at least partially within the waveguide and opposite to or facing each other with a designated space therebetween, wherein at least one of the side walls and at least one of the directional antennas are integrated into one printed circuit board, and the directional antennas are configured to transmit and receive an electromagnetic signal to and from each other using at least a part of the waveguide.

BRIEF DESCRIPTION OF THE DRAWINGS

The above and other aspects, features and advantages of certain embodiments of the present disclosure will be apparent from the following detailed description, taken in conjunction with the accompanying drawings, in which.

It should be appreciated that the figures may be presented schematically and not to scale, and are intended promote understanding of the disclosure.

DETAILED DESCRIPTION

Figure 1A:
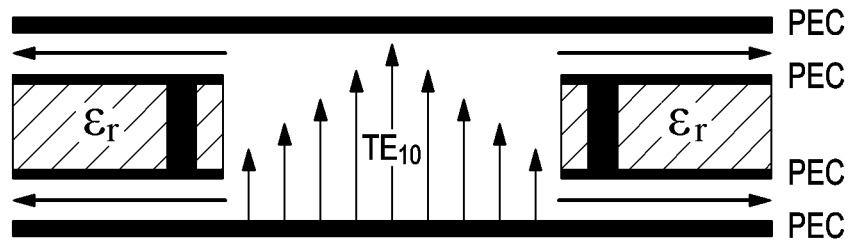
FIGS. 1A, 1B, and 1C are diagrams illustrating a known contactless AF-SIW waveguide.
Figure 1B:
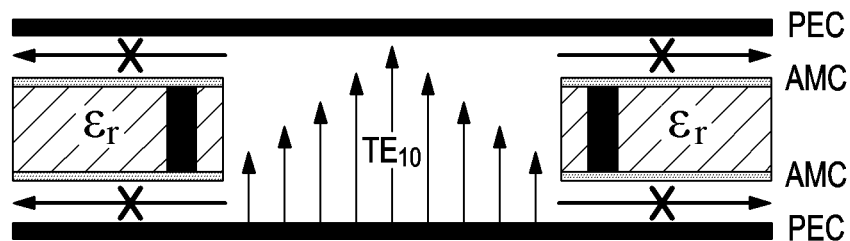
Figure 1C:
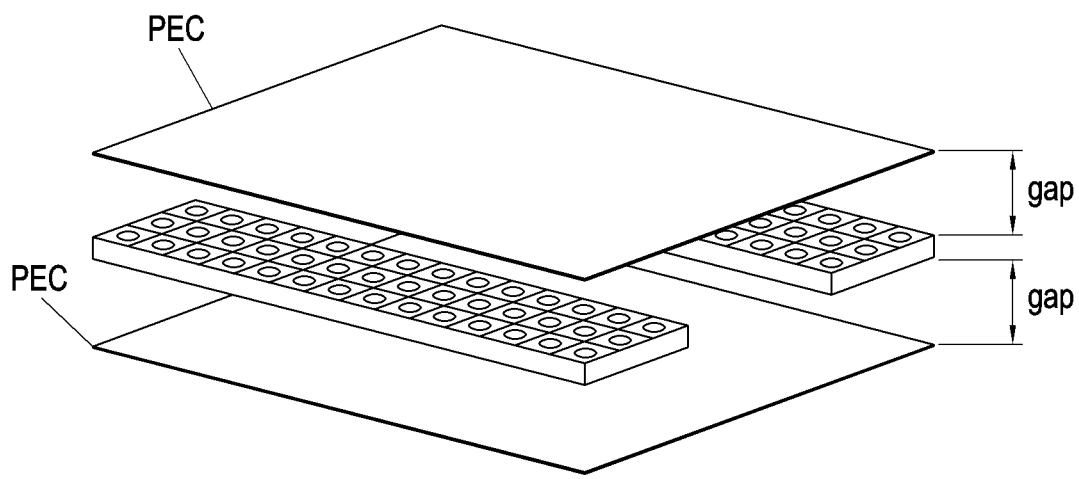
Figure 2:
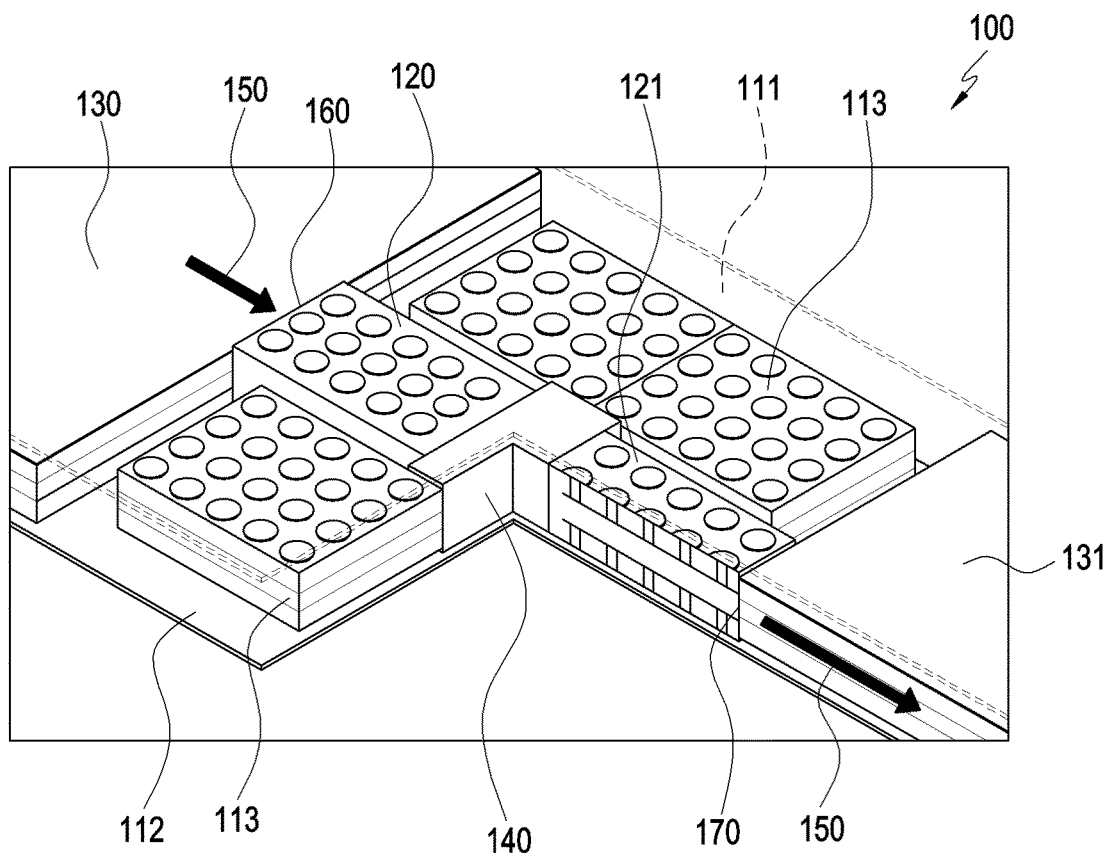
FIG. 2 is a cross-sectional perspective view of a signal transmission device according to various embodiments.
Figure 3:
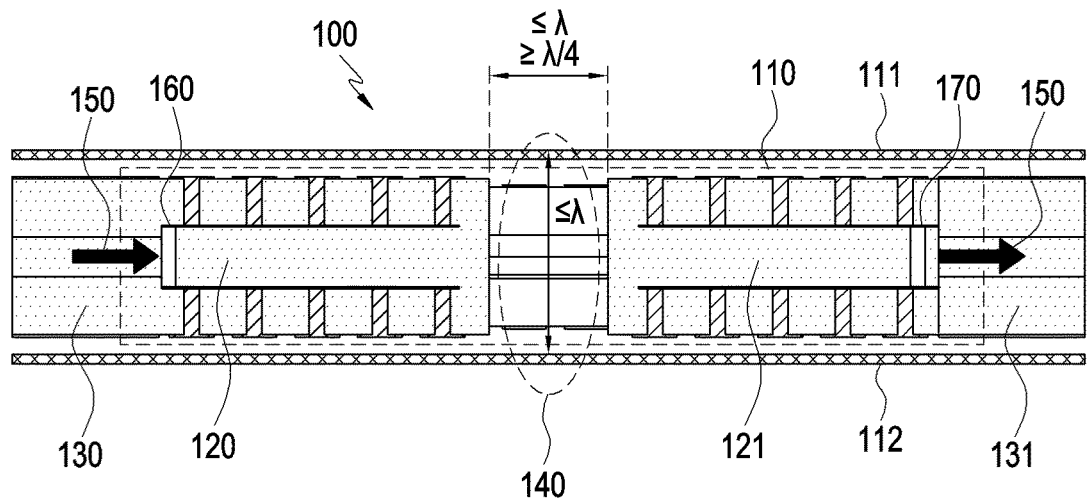
FIG. 3 is a cross-sectional side view of a signal transmission device according to various embodiments.
Figure 4:
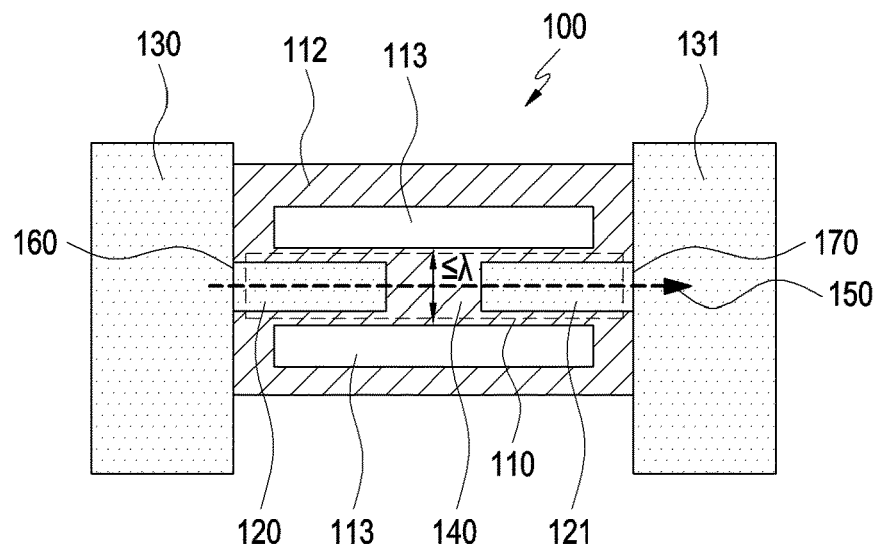
FIG. 4 is a cross-sectional top view of a signal transmission device according to various embodiments.

FIGS. 2, 3 and 4 illustrate an example device 100 for transmitting signals according to various embodiments. The device 100 comprises a waveguide 110 and directional antennas (or adapters) 120 and 121 located therein. Directional antennas are arranged opposite to or facing each other with a designated space (or a designated interval) therebetween at least partially in a waveguide, and transmit and receive electromagnetic signals to and from each other using at least a part (e.g., a wireless channel 140 described below) of the waveguide.

The upper and lower bases in the waveguide 110 are formed by conductive (e.g., metal) plates 111 and 112 located in parallel to each other, e.g. they form a parallel plate waveguide. Side walls of the waveguide 110 are formed by electromagnetic band gap (EBG) structures 113 located between the bases, whereby the wall together with bases form a rectangular waveguide, in which electromagnetic waves may propagate. For example, when viewed from a cross section orthogonal to a direction in which the electromagnetic signals are transmitted, the upper and lower portions of the waveguide 110 may be surrounded by the conductive plates 111 and 112 and side(s) of the waveguide 110 may be surrounded by the EBG structures 113 arranged between the conductive plates 111 and 112. In an embodiment, the waveguide 110 may extend in the direction in which the electromagnetic signals are transmitted, and the inside of the waveguide 110 may be filled with the air or other dielectrics. Each EBG structure 113 is separated from one of the bases or from both bases by a dielectric (for example, air) gap and at the same time forms a side or a side wall having the conditions of an artificial magnetic conductor (AMC) and blocks the leakage of waves (e.g., electromagnetic signals) from the waveguide 110 into the external space.

The antennas 120 and 121 are located opposite to or facing each other along the radiation axis, e.g., in a direction in which electromagnetic signals 150 are transmitted. In addition, the antennas 120 and 121 may include a substrate integrated waveguide (SIW) implemented based on a printed circuit board. As an example, in FIGS. 2 through 4, the first antenna 120 may be a part of the first printed circuit board 130, and the second antenna 121 may be a part of the second printed circuit board 131. According to an embodiment, the first printed circuit board 130 and the second printed circuit board 131 may be two different parts of substantially one board, and a conductive base (e.g., the conductive plates 111 and 112) and/or side walls (e.g., the EBG structure indicated by '113') may be integrated into one printed circuit board. Hereinafter, various arrangements of printed circuit boards, antennas and EBG structures will be shown, so it should be appreciated that the disclosure is not limited to these embodiments.

According to various embodiments, an area filled with air or other dielectric remains between the antennas 120 and 121 inside the waveguide 110, in which a wireless channel 140 is formed for transmitting the electromagnetic signals 150 between the antennas 120 and 121. To ensure the conditions for free propagation of the signal 150 in the wireless channel 140, the distance between the bases (e.g., the conductive plates 112 and 112) is at least $\lambda/2$ (e.g., half the wavelength of the transmitted signal) for the transmitted signal. On the other hand, to prevent and/or restrict parasitic radiation and leakage beyond the wireless channel 140, the distance (e.g., a space between the EPG structures 113) between the inner boundaries of the side walls (e.g., the EBG structures 113) should be no more than $\lambda$, the distance between the edges of the antennas 120 and 121 should be no less than $\lambda/4$ (a quarter of the wavelength) and no more than $\lambda$, and the distance between the bases (e.g., the conductive plates 111 and 112) should be no more than $\lambda$. For example, the maximum size of the wireless channel 140 is a $\lambda \times \lambda \times \lambda$ cub. In addition, the size of the gap between the EBG structure 113 and the base (e.g., the conductive plates 111 and 112) should not exceed $\lambda/4$.

According to various embodiments, the high frequency signal 150 from an RFIC (radio frequency integrated circuit) located in the first printed circuit board 130 side is fed to the input 160 the device 100 (e.g., the input of the first antenna 120), then radiated by the first antenna 120 in the wireless channel 140, received from the wireless channel by the antenna 121, and transmitted from the output 170 (e.g., the output of the second antenna 121) to an RFIC located in the second PCB 131 side. It should be appreciated that the indications "input" and "output" are conditional, and if necessary, the electromagnetic or high frequency signal 150 may be transmitted in the opposite direction.

Each antenna (for example, in the SIW waveguide) 120 or 121 may have one or more matching elements 180 and 181 (refer to FIG. 6) located near the wireless channel 140. The matching element 180 or 181 allows an electromagnetic wave to be radiated from the SIW waveguide into the wireless channel 140 with minimal backward losses.

Considering the operation of the device 100, the following can be noted. Assuming that the first antenna 120 (e.g., the transmission antenna) is an isotropic radiator, then the first antenna 120 radiates electromagnetic energy of the same intensity in all directions without loss. The radiation pattern of such antenna is circular, e.g., sphere-shaped, in all sections. Assuming that the aperture of the second antenna 121 (e.g., a receiving antenna) has a size a×b and is located at a distance R from the first antenna 120, then in the most general case, in the absence of obstacles around an isotropic radiator, the radiation occurs entirely in three-dimensional space, and the received power at the second antenna 121 will be given by Equation 1 below.

$$P_{rx} = P_{source} \frac{1}{4\pi} \frac{a}{R} \frac{b}{R} \quad \text{[Equation 1]}$$

Herein, '$P_{rx}$' indicates a received power, and '$P_{source}$' indicates a supplied power or a supplied high frequency signal.

When around the first antenna 120, a parallel plate waveguide is placed based on two parallel bases (e.g., the conductive plates 111 and 112) at a distance a from each other, then the radiation will occur (e.g., in a circular shape) in the plane between the substantially parallel bases, but in all directions, and then the received power on the second antenna 121 will increase by (2R)/b times.

By placing side walls in the form of EBG structures 113 around the first antenna 120, it is possible to provide radiation only in a straight line, but in two directions, and in this case, the received power at the second antenna 121 will increase by πR/a times.

Because the first antenna 120 in the disclosure is actually directional, only a straight-line radiation in one direction is provided, and therefore the received power $P_{rx}$ at the second antenna 121 is equal to the supplied power or supplied frequency signal $P_{source}$. For example, in the arrangement according to the disclosure, as the antennas 120 and 121 have directivity together with arrangement of the side walls (e.g., the EGB structure 113) of the conductive bases (e.g., the conductive plates 120 and 121), all power of the source (e.g., the first antenna 120) may be provided to the receiver (e.g., the second antenna 121) substantially without a loss.

Thus, the signal (e.g., the electromagnetic or high frequency signal 150) is transmitted between the antennas 120 and 121 of the device 100 with high efficiency and low losses, and moreover the device is suitable for transmitting data signals at a high rate of up to 2 Gbps or more.

Figure 5:
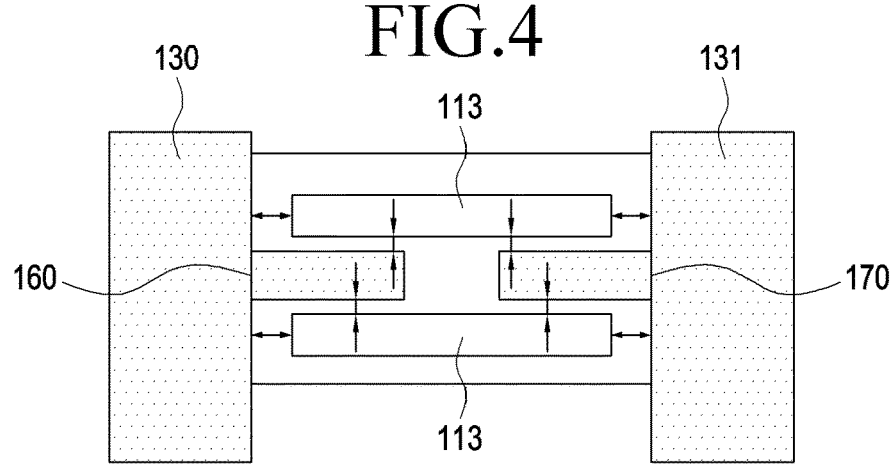
FIG. 5 is a diagram illustrating directions of tolerances in the relative positioning of the device elements during assembly according to various embodiments.

It is possible to create the waveguide structure simply by placing conductive bases (e.g., the conductive plates 111 and 112) nearby or in contact with printed circuit boards (e.g., the first and second printed circuit boards 130 and 131) comprising the antennas 120 and 121 and the EBG structures 113. For example, the device 100 may be manufactured using a massive production technique, and thus may be suitable for cheap and massive production. The device 100 does not require a galvanic contact, not only between a plurality of different (e.g., two) printed circuit boards (e.g., the first and second printed circuit boards 130 and 131), between which a signal should be transmitted, but at all between different elements of the device. Moreover, as shown in FIG. 5, all elements of the device do not have strict assembly tolerances. In an embodiment, in a direction of arrows shown in FIG. 5, an assembly or manufacturing tolerance of about 1 mm may be allowed, and in a direction perpendicular to a plane shown in FIG. 5, an assembly or manufacturing tolerance of about 0.5 mm may be allowed. For example, the device 100 may have more generous assembly tolerance, facilitating manufacturing and being suitable for transmission of data signals at a high speed up to 2 Gbps or more. For ease of understanding, it should be noted that in FIG. 5, reference designations of various elements may be omitted and a top view that is the same as or similar to FIG. 4 is shown. Thus, the disclosure provides simplifying of assembly and manufacturing, because such structure significantly simplifies the manufacturing process and reduces the requirements to accuracy and manufacturing tolerances, thereby facilitating manufacturing.

Next, elements of the signal transmission device 100 will be described in greater detail.

Figure 6:
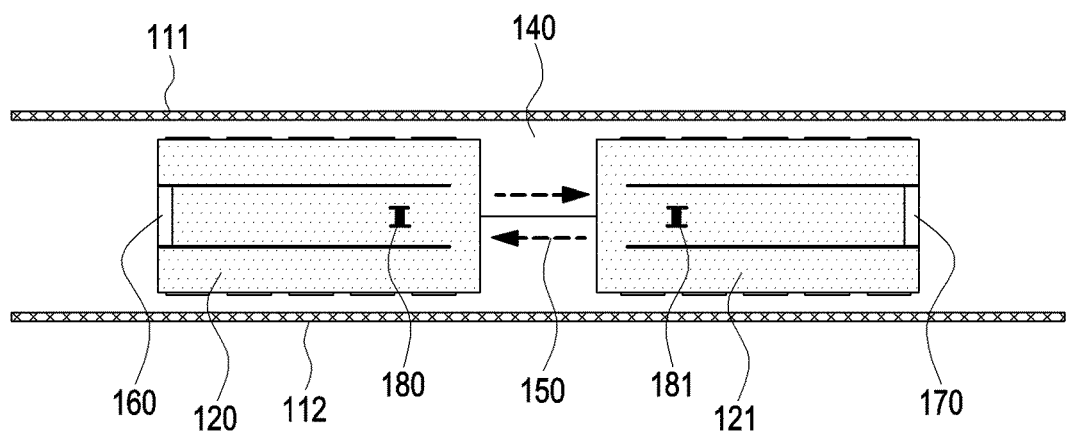
FIG. 6 is a cross-sectional side view of a signal transmission device according to various embodiments.

In the disclosure, the parallel plate waveguide 110 may be used to collect an electromagnetic field in the wireless channel 140 between the printed circuit boards 130 and 131. In FIG. 6, the dotted line with an arrow illustrates that the electromagnetic wave may be excited by the first antenna 120 for transmission to the second antenna 121, and/or by the second antenna 121 for transmission to the first antenna 120.

According to various embodiments, the electromagnetic wave may be transmitted substantially without loss, when the condition of resonance with the required center frequency should be met in the wireless channel 140.

Figure 7:
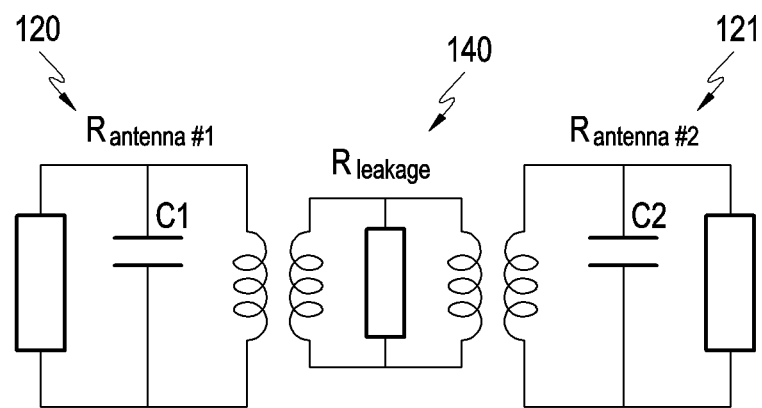
FIG. 7 is a diagram illustrating an equivalent circuit of an example device for the case of a parallel plate waveguide without side walls according to various embodiments.

FIG. 7 is a diagram illustrating an equivalent circuit of the device 100 to aid in calculations according to various embodiments. It shows that at the interface of two media between the antenna 120 or 121 and the wireless channel 140, inductive coupling occurs, similarly with a transformer. When the parallel plate (e.g., the conductive plate 111 or 112) waveguide 110 has no side walls (e.g., the EBG structures 113), there is an open space around the wireless channel 140, into which a part of the antenna radiation may leak. Therefore, each medium (the first antenna 120, the wireless channel 140, the second antenna 121) has some inherent resistance $R_{antenna\ \#1}$, $R_{leakage}$, and $R_{antenna\ \#2}$. To obtain the resonance condition, a matching element (e.g., the matching element 180 or 181 of FIG. 6) having capacitive properties should be used in each antenna. The matching elements in the first antenna 120 and in the second antenna 121 have capacitances C1 and C2, respectively, as illustrated in FIG. 7.

Figure 8:
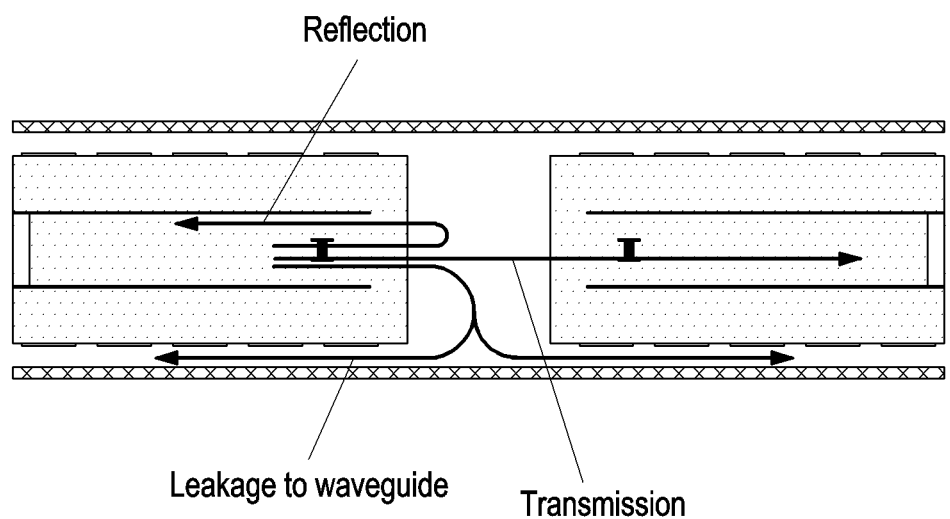
FIG. 8 is a diagram illustrating power flow distribution in an antenna according to various embodiments.
Figure 9A:
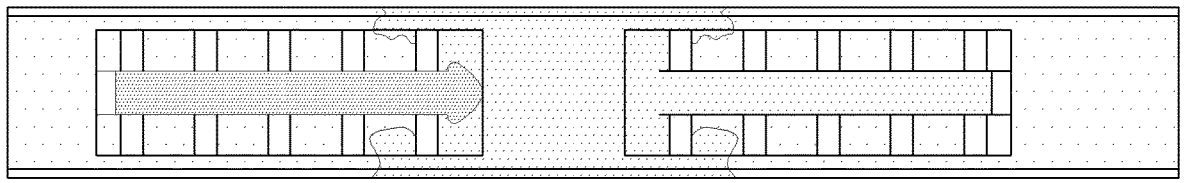
FIGS. 9A and 9B are diagrams illustrating example electromagnetic field distribution diagrams in a parallel plate waveguide according to various embodiments.
Figure 9B:
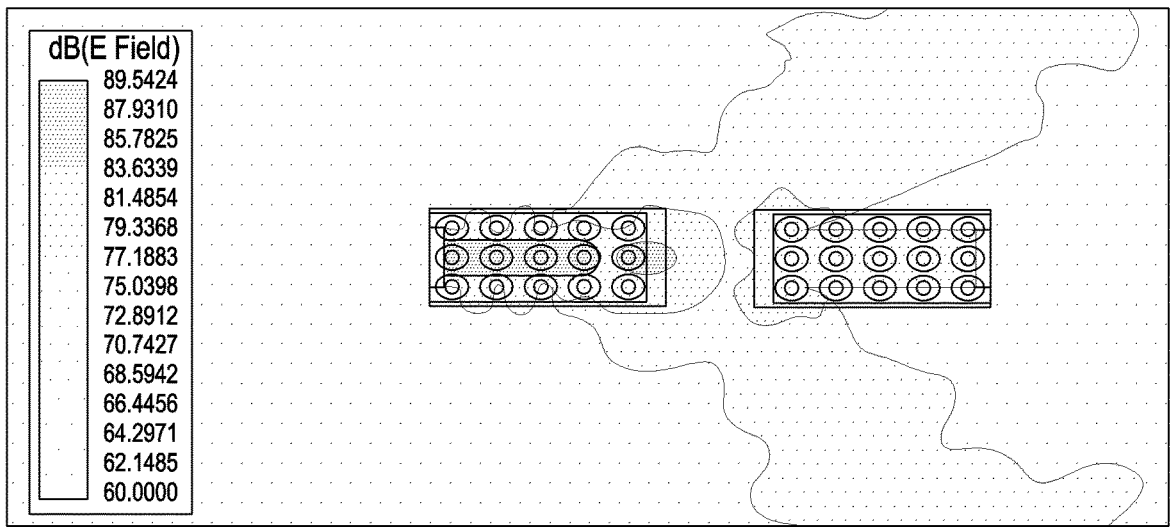

FIG. 8 is a diagram illustrating example power flow distribution in the antenna according to various embodiments. Reference designations of various elements may again be omitted for ease of understanding and may be found in other drawings, such as FIGS. 3 and 6. Possible wave directions (e.g., power flow or distribution of power flow) include transmission, reflection, and leakage to the waveguide 110. Diagrams illustrating examples of the electromagnetic field distribution in the parallel plate waveguide are shown in side view and top view of FIGS. 9A and 9B, respectively. A sufficiently large part of the radiation power excited by the first antenna 120 enters the second antenna 121 over the wireless channel 140 area, and a part is distributed in the side of the second antenna 121, that is, there is some leakage.

Figure 10:
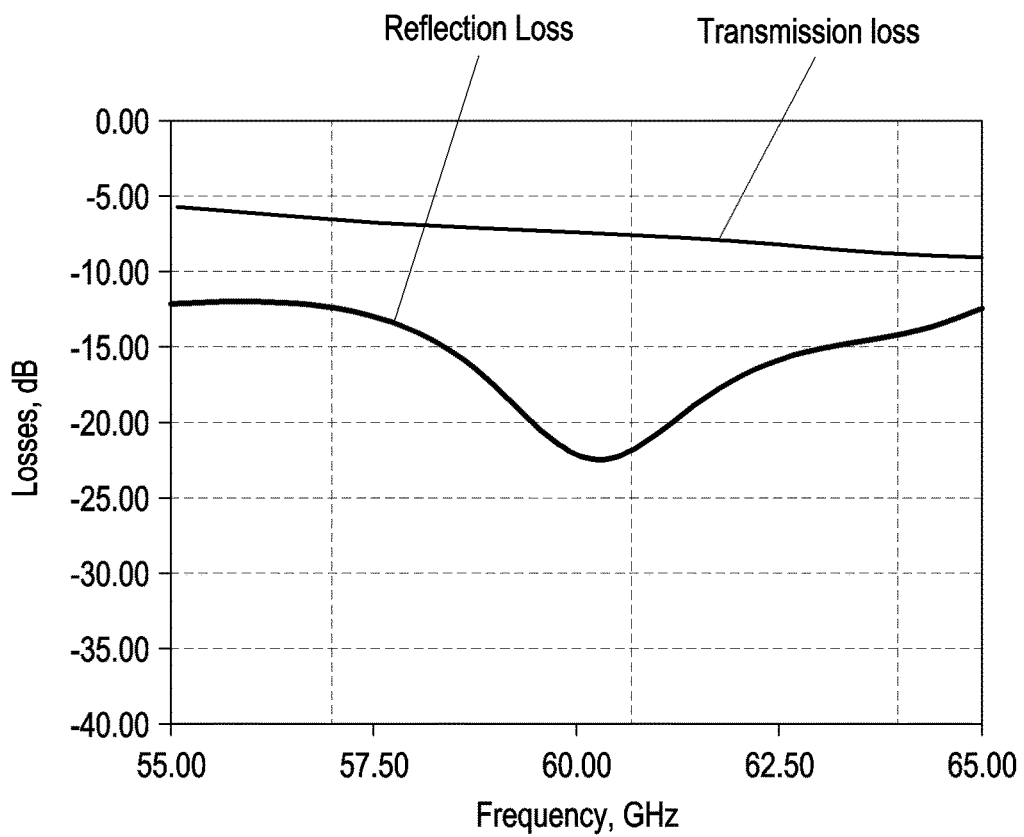
FIG. 10 is a graph illustrating simulation results of an example device for the case of a parallel plate waveguide without side walls according to various embodiments.

The case of a parallel plate waveguide without side walls at 60 GHz has been simulated, and the corresponding loss plots shown in FIG. 10 have been obtained. For example, the following S-parameters were obtained: the transmission loss coefficient in the operating frequency band was about −7 dB, the return loss coefficient was about −22 dB. As can be seen, most of the signal (about 75%) is transmitted from one antenna to another antenna without high return loss and leakage, while the antenna matching is not degraded. The losses are about 25% of the radiated power. Accordingly, the parallel plate waveguide indeed allows concentrating the electromagnetic field in the wireless channel between antennas. Thus, the radiation is isolated in one plane (a plane or space between the conductive plates 111 and 112) and a relatively high energy efficiency is already achieved. Next, it will be shown how the loss reduction is achieved according to the disclosure.

To prevent and/or restrict leakage into an open space between the bases (e.g., the conductive plates 111 and 112), side walls based on the EBG structures 113 are used. Together with the bases (e.g., the conductive plates 111 and 112), the EBG structures 113 form a waveguide (e.g., the waveguide 110 of FIG. 3 or 4) have a substantially rectangular cross section orthogonal to the radiation axis (e.g., the direction in which the electromagnetic signal or high frequency signal 150 is transmitted).

Figure 11:
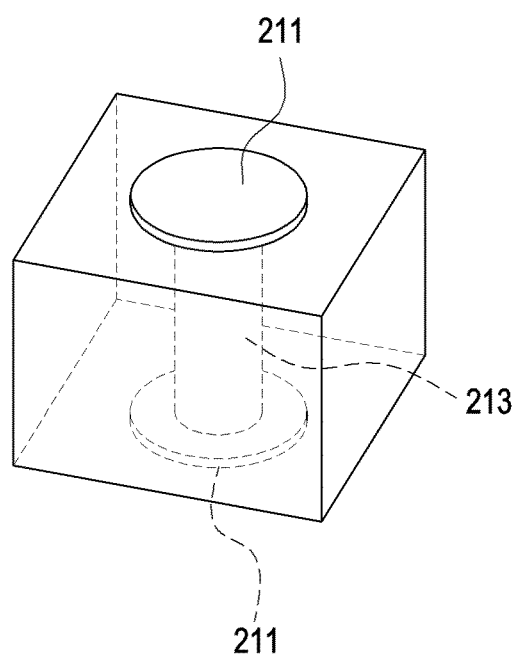
FIG. 11 is a diagram illustrating an example configuration of an elementary cell of an EBG structure according to various embodiments.

The EBG structure 113 may be made based on a double-sided printed circuit board and/or a multi-layer printed circuit board, and includes a plurality of cells located side by side as a two-dimensional periodic lattice. The structure of an elementary cell of the EBG structure 113 is shown in FIG. 11. The elementary cell comprises parallel conductive portions (e.g., contact pads 211) of the upper and lower conductive layers of the printed circuit board, the parallel conductive portions being connected to each other by a conductive element 213 passing through a dielectric layer of the printed circuit board—for example, a metallized through opening (via). The sizes and shape of the conductive portions are selected according to the requirements of the specific application, e.g., a frequency of a signal transmitted between the antennas 120 and 121 or a size of the device 100 to be manufactured actually, and size and arrangement space of the printed circuit boards 130 and 131 or the antennas 120 and 121. In a general case, the conductive portions (e.g., the contact pads 211) of neighboring cells are not electrically connected to each other, and the EBG structure itself is separated from the bases (e.g., the conductive plates 111 and 112) by a dielectric (for example, air) gap.

Figure 12:
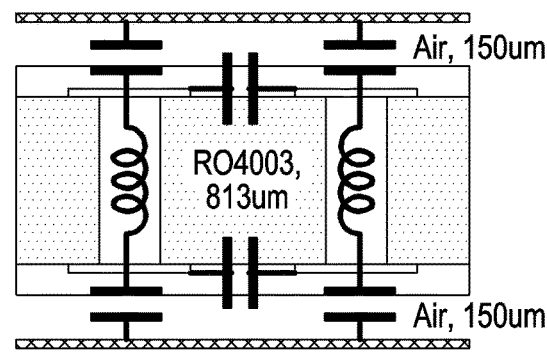
FIG. 12 is a diagram illustrating an equivalent circuit of an EBG structure according to various embodiments.

The equivalent circuit of such EBG structure is shown in FIG. 12. In particular, the air-filled area between bases and conductive portions (e.g., the contact pads 211) have capacitive coupling, areas between the conductive portions of adjacent cells also are characterized by capacitive coupling, and via areas function as inductive elements. Thus, a high-Q resonator is formed.

Figure 13:
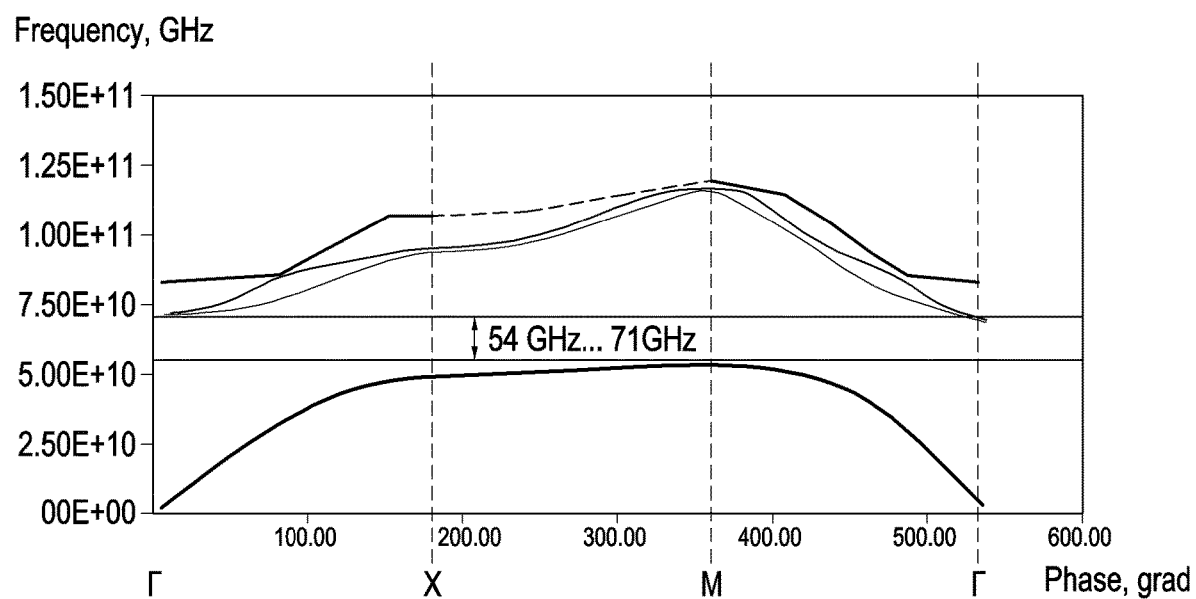
FIG. 13 is a graph illustrating a frequency response of a waveguide with an EBG structure according to various embodiments.

According to an embodiment, the EBG structure blocks the leakage of waves at desired frequencies from the wireless channel to the external space by forming, in the working frequency range, a bandgap in the wireless channel 140 between the bases (e.g., the conductive plates 111 and 112) and the side walls (e.g., the EBG structures 113). A simulation of the EBG structure based on the printed circuit board, for which the substrate of the microwave material Rogers RO 4003® was applied was performed; and the graphs shown in FIG. 13 were obtained. As shown from the graph represented in FIG. 13 for the dependence of frequency of the signal transmitted through the EBG structure on the phase shift realized in each cell of this structure, the wave leakage may be blocked in this structure in a certain frequency range (in the bandgap zone, which is located between two parallel lines on the vertical axis). Thus, the first mode propagates at frequencies up to 54 GHz, the remaining modes—at frequencies from 71 GHz. Thus, due to the EBG structure, the power in the operating frequency range (for example, about 60 GHz) is prevented and/or restrict from leaking out of the waveguide, and may be received through the receiving antenna (e.g., the second antenna 121) over the wireless channel 140.

Accordingly, while having a compact size, the device has very low losses, and its assembly or manufacturing does not require strong and reliable contact between the layers.

Although such arrangement of the EBG structure and side wall(s) based on the arrangement are quite effective, each change in geometry leads to the need to recalculate the entire EBG structure to maintain the required frequency band. This makes it possible to design only a single-mode waveguide due to the limitation on the height of the waveguide. When attempting to transmit waves in a wide frequency range, a part of the waves may flow into the gaps between vias (e.g., the conductive element 213 of FIG. 11) and into the gaps between the bases (e.g., the conductive plates 111 and 112) of the EBG structure and the conductive portions (e.g., the contact pads 211) of the EBG structure. In addition, this arrangement requires the use of high quality RF materials such as that indicated above. Therefore, despite its high efficiency, this arrangement of the EBG structure has a relatively narrow field of application.

Figure 14:
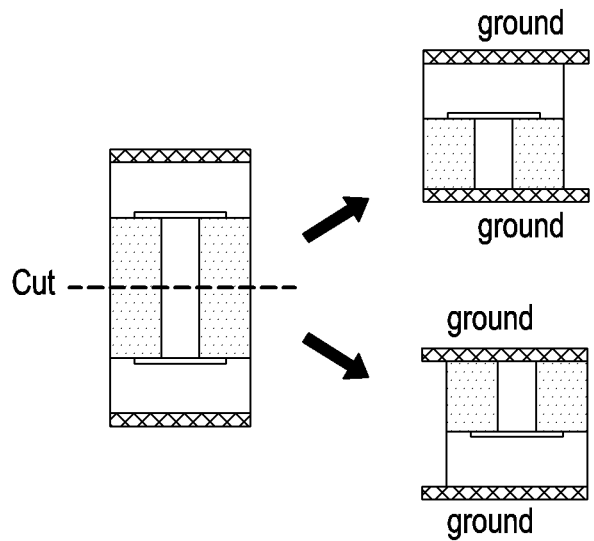
FIG. 14 is a diagram illustrating an example of obtaining a new arrangement of the EBG structure according to various embodiments.
Figure 15:
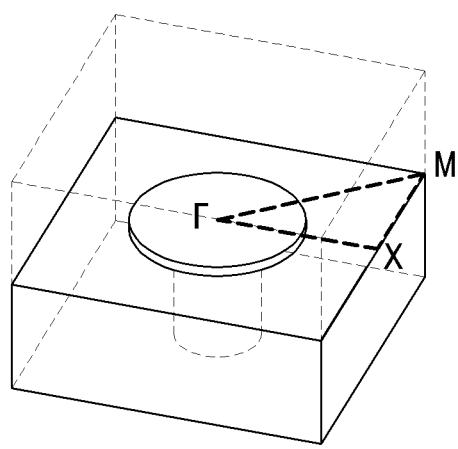
FIG. 15 is a diagram illustrating an example structure of the elementary cell of a truncated EBG structure according to various embodiments.

To increase the versatility, it is proposed to use new arrangement of the EBG structure. For example, as shown in FIG. 14, each cell is split or cut into two parts in the via area and shorten the via to the ground plate. As a result, the structure of the elementary cell of the truncated EBG structure takes the form shown in FIG. 15. In this case, the elementary cell comprises conductive areas (for example, contact pads) of the upper and lower conductive layers of the printed circuit board, being parallel to each other and connected to each other by a conductive element passing through the dielectric layer of the printed circuit board—for example, through a metallized opening (via). The conductive portions of neighboring cells in one layer are not electrically connected to each other, but in another layer (e.g., a ground plate) they are electrically connected to each other. For example, substantially, the conductive portions of the neighboring cells are coupled to the ground layer. On the side where the conductive portions of neighboring cells are not electrically connected to each other, the truncated EBG structure may be separated from the nearby base (e.g., the conductive plate 111 or 112) by a dielectric (e.g., air) gap.

Figure 16:
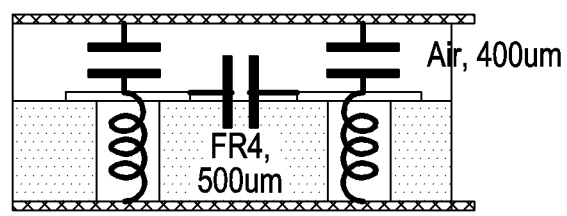
FIG. 16 is a diagram illustrating an equivalent circuit of a truncated EBG structure according to various embodiments.

The equivalent circuit of such a truncated EBG structure is shown in FIG. 16. In particular, the air-filled areas between the base and the conductive portions have capacitive coupling, areas between the conductive portions (e.g., the contact pads 211 of FIG. 11) of adjacent cells are also characterized by capacitive coupling, and via areas function as inductive elements. Thus, there is only one air gap, which requires less inductance and therefore results in a lower Q factor than in the previous arrangement.

Figure 17:
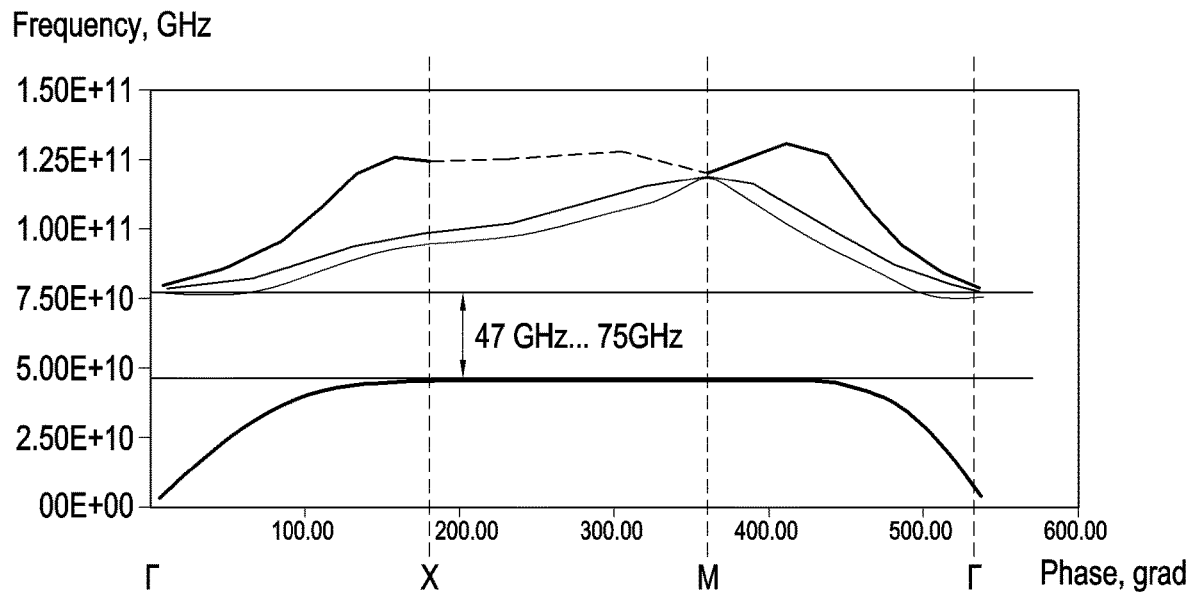
FIG. 17 is a diagram illustrating a frequency response of a waveguide with a truncated EBG structure according to various embodiments.

A simulation of the truncated EBG structure was performed, and in this case a substrate made of conventional FR4 material may be provided as a printed circuit board. The corresponding graphs are shown in FIG. 17. As shown in the graph of the dependence of frequency of the signal transmitted through the truncated EBG structure on the phase shift represented in FIG. 17, the first mode propagates at frequencies up to 47 GHz, the remaining modes at frequencies from 75 GHz. Thus, the use of the truncated EBG structure allows the top and bottom pads to be decoupled from each other, reduces inductance, and expands the operating bandwidth. As discussed above, while having a compact size, the device has very low losses, and at the same time, its assembly or manufacturing does not require strong and reliable contact between the layers. Moreover, this arrangement allows the use of commonly used PCB materials and/or processes, further simplifying the fabrication of the device.

Figure 18:
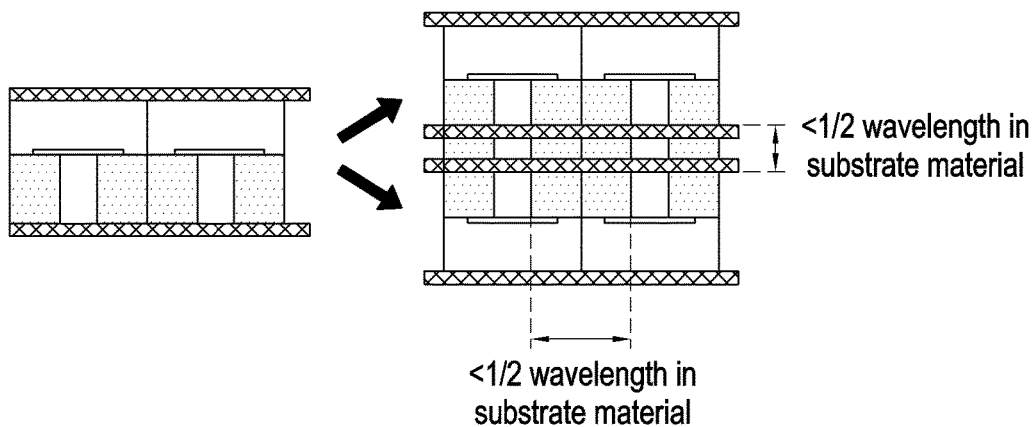
FIG. 18 is a diagram illustrating an example EBG structure according to various embodiments.

FIG. 18 is a diagram illustrating an example EBG structure according to various embodiments. Two truncated EBG structures are mirrored relative to their ground plates, and vias of the first truncated EBG structure are arranged coaxially and are connected to vias of the high-quality other truncated EBG structure. Thus, EBG structures can be located both on the outer and inner layers of the printed circuit board. An intermediate layer may be arranged between the ground plates (layers) of these two truncated EBG structures, for example, as a substrate of the printed circuit board, through which the first vias and the second vias are interconnected. The first vias and the second vias are interconnected through an additional via. The distance between the ground plates of the two truncated EBG structures, and the distance between adjacent vias should be less than half the wavelength in the substrate material to prevent and/or restrict leakage of high-frequency power into the intermediate layer. The minimum number of rows of EBG cells sufficient to prevent and/or restrict leakage is 2. If required, multiple intermediate layers (e.g., dielectric layers) separated by ground layers may be used, provided that the distance or space between vias and/or between ground layers are maintained. All this allows varying the sizes of the structure (for example, by increasing the thickness) without serious restrictions. Such EBG structure allows both horizontal waveguide structure and vertical waveguide structure to be designed.

Figure 19:
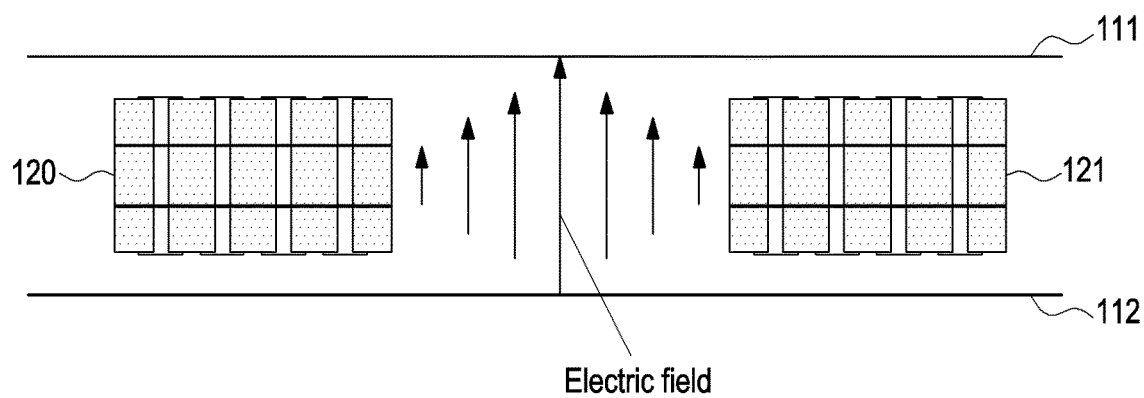
FIG. 19 is a diagram illustrating an electric field in a wireless channel according to various embodiments.
Figure 20:
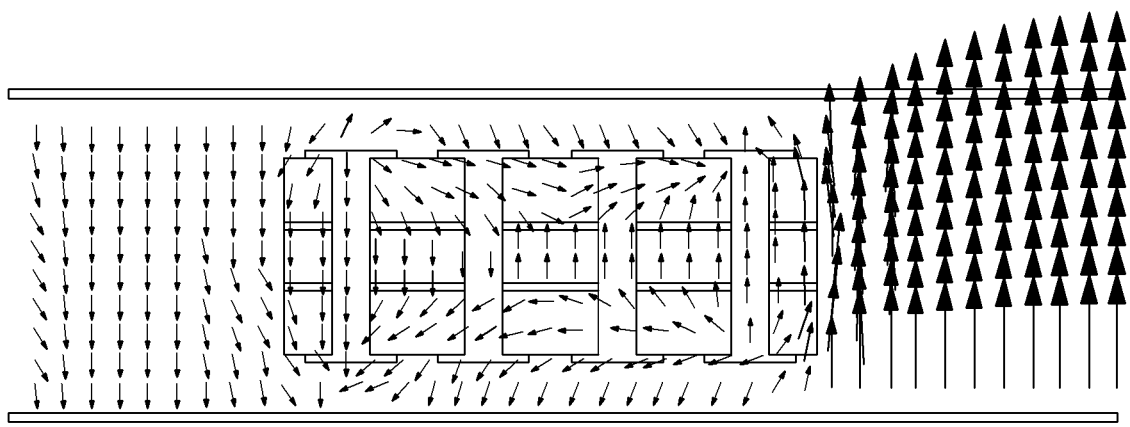
FIG. 20 is a diagram illustrating electric field distribution in a waveguide according to various embodiments.

A simulation of this EBG structure was performed, resulting in a graph of the electric field distribution in the waveguide around the EBG structure. A schematic representation of an electric field in a wireless channel is shown in FIG. 19 and a simulation graph is shown in FIG. 20. Thin short arrows indicate the minima of the electric field values, and bold long arrows indicate the maxima of the electric field values. As illustrated, there is almost no leakage, and the entire field is concentrated in the area of the wireless channel.

Spacers (see FIG. 37) can be located between the EBG structure and the base (e.g., the conductive plate 111 or 112) in the air gap area, to fix the EBG structure and provide this gap. The spacers can be separate elements, or a part of the printed circuit board with an EBG structure, or a part of bases. For example, in one embodiment, the spacers can be formed as protrusions on the waveguide base and on the layers of the printed circuit boards having the EBG structure, and in another embodiment, the spacers can be separate elements that are inserted between the layers in the manufacturing process. Thereby, additional versatility of designing and simplifying of manufacturing are provided. Spacers can be either conductive or non-conductive, but must not shorten adjacent EBG elements. If it is necessary to use conductive spacers, the distance from them to the boundary between the EBG structure and the wireless channel should be more than three cells of the EBG structure (e.g., the cell arrangement includes three rows) to prevent and/or restrict unwanted phenomena in the waveguide. For example, when the spacers have conductivity, at least three cells may be arranged between the spacer and the wireless channel.

In various embodiments, all or some of the spacers may not only perform a function of making an air gap between the EBG structure and the base, but also a function of fastening means. So, for example, glue drops can be used as spacers or part of them, or fasteners, such as screws to tie the structure, can pass through the spacers. In other embodiments, the fastening of the structural elements such as the waveguide and antenna may be performed by other means, without being limited to the spacers. Each of these possibilities also allows increasing design versatility.

Figure 21:
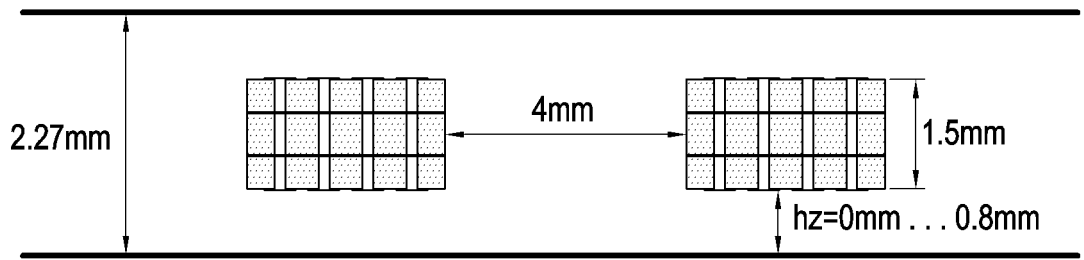
FIG. 21 is a diagram illustrating an example construction for simulating air gap variations according to various embodiments.
Figure 22A:
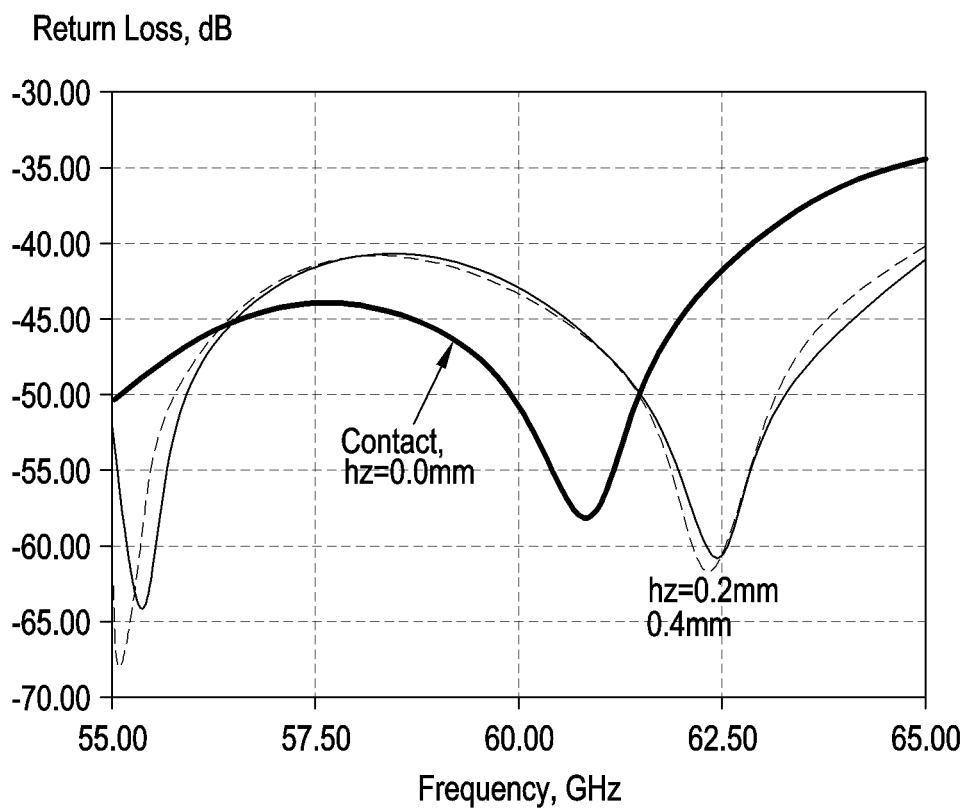
FIGS. 22A, 22B and 22C are graphs illustrating simulation results for air gap variations according to various embodiments.
Figure 22B:
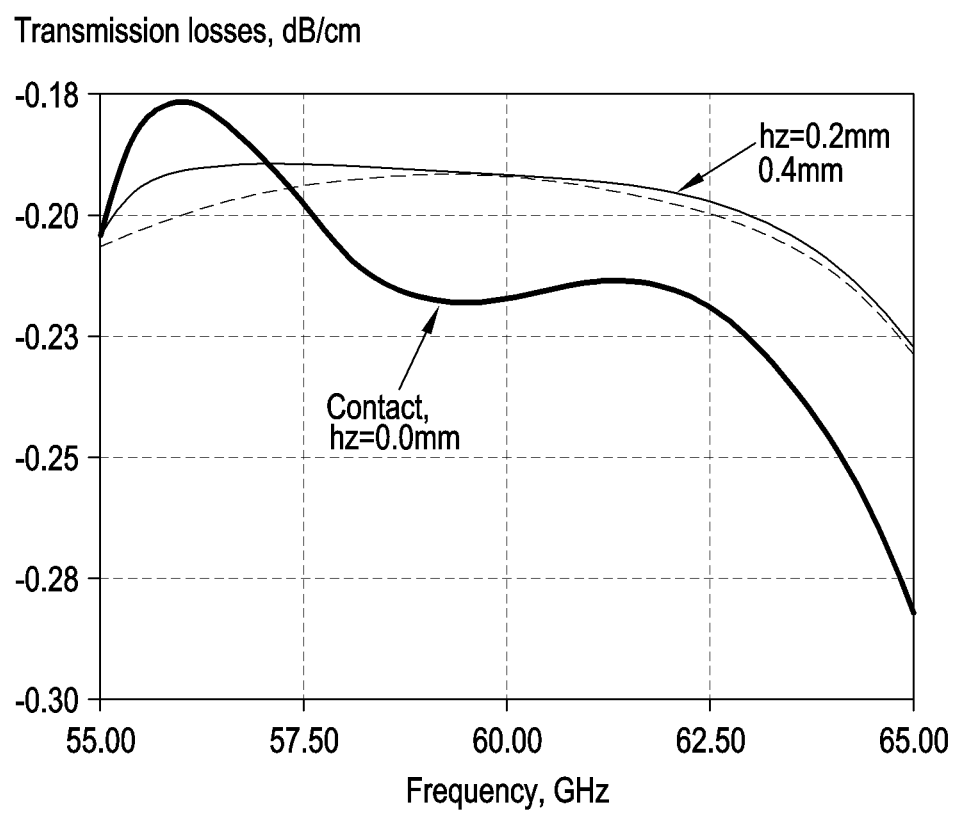
Figure 22C:
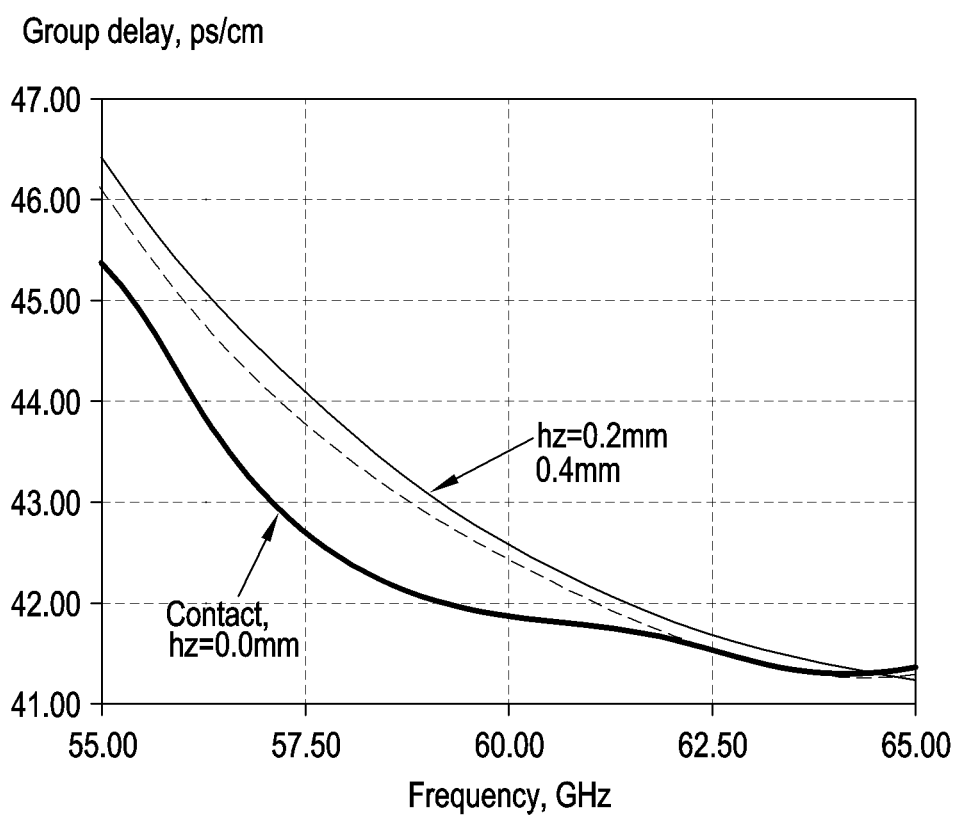
Figure 23A:
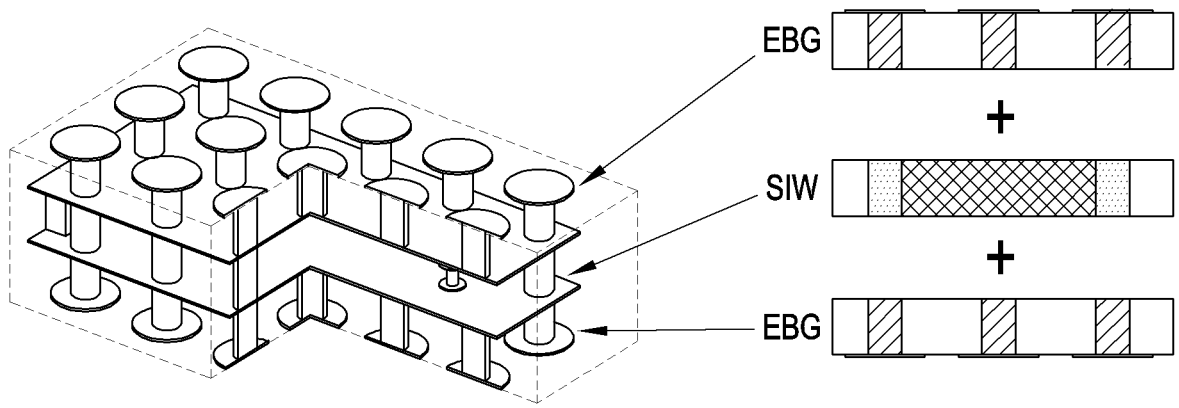
FIGS. 23A, 23B, 23C, 23D and 23E are diagrams illustrating forming an antenna based on a SIW waveguide between truncated EBG structures according to various embodiments.
Figure 23B:
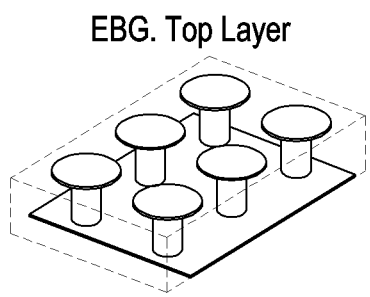
Figure 23C:
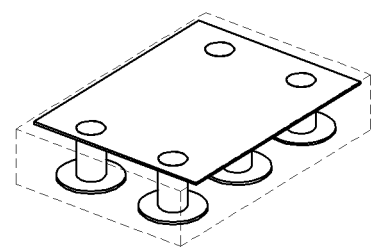
Figure 23D:
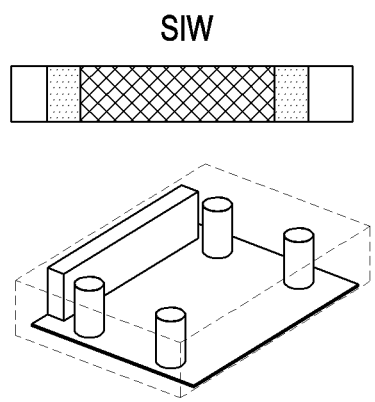
Figure 23E:
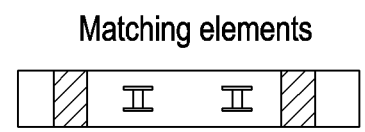

Although it is suggested to separate EBG structures from the bases with spacers to form an air gap in order to provide the best performance, variations in the size of the air gap between them are quite acceptable. As an example, a simulation of gap variations for the 60 GHz case (FIG. 21) was performed. In this case, the wavelength λ at a frequency of 60 GHz is 5 mm. The distance between the bases was chosen to be equal to about 2.27 mm, the thickness of the EBG structure was chosen to be equal to about 1.5 mm, the distance between the EBG structures was chosen to be equal to about 4 mm. When the distance between the bases and the thickness of the EBG structure are as illustrated above, in simulation corresponding to gap changes, a vertical position of the EBG structure in the waveguide, e.g., a space or an air gap hz from galvanic contact with the bottom base of the waveguide to galvanic contact with the top base of the waveguide may be varied in the interval 0 mm . . . 0.77 mm. The space or air gap hz is based on a space between the bases (e.g., the conductive plates 111 and 112) and a thickness of a side wall including the EBG structure, and may increase to about 0.8 mm according to an embodiment. The maximum allowable gap hz is a quarter wavelength of the transmitted signal, and the maximum value of the air gap hz in the case of the working frequency of 60 GHz is 1.25 mm. For example, the maximum value of the air gap hz of 0.77 mm may be sufficiently applied to the case where the working frequency is 60 GHz. As shown in the graphs in FIGS. 22A, 22B and 22C, the parameters of the air gap hz do not have a significant effect on the parameters of the device as a whole unless the EBG structure is not in contact with the base (hz=0). For example, the scatter of parameters (reflection coefficient, transmission coefficient and group delay) may not be substantially affected by the size of the air gap hz or variation (e.g., manufacturing deviation) of a vertical position of a side wall(s). Thus, it can be noted once again that the structure of the device as a whole is very versatile and does not require high manufacturing precision.

According to an embodiment, a broadband EBG structure with an independent change in thickness may be obtained because there is little change in parameters of the device with a vertical position of a side wall(s) including the EBG structure 113 between the bases (e.g., the conductive plates 111 and 112). For example, it may be multi-layer, when it is necessary to increase the thickness and to overcome technological limitations. For example, the following is provided: isolation of radiation in an unnecessary direction, variable thickness of the assembly, widening of the bandwidth, reducing of sensitivity to assembly accuracy, expanding of the possible field of application, and the possibility of using conventional materials for manufacturing printed circuit boards.

The following describes in greater detail example embodiments of various antennas (e.g., the antennas 120 and 121 of FIGS. 2 through 4).

The antenna is implemented based on a printed circuit board and comprises at least one matching element (e.g., the matching elements 180 and 181 of FIG. 6) and a resonant structure. The resonant structure is located on the top and bottom layers to prevent and/or restrict back radiation. The matching elements are intended to reduce losses, for example, by matching the antenna to the wireless channel (e.g., the wireless channel 140 of FIGS. 2 through 4), as shown above. The antenna is at least partially placed within a waveguide (e.g., the waveguide 110 of FIG. 3 or 4) having a resonant structure. Antenna power supply may be implemented through different structures such as using microstrip line, strip line, SIW waveguide and others. In the case of a SIW waveguide, power is supplied between the resonant structure in the middle layers of the printed circuit board.

For example, when the SIW waveguide is used, the waveguide may be enclosed between two truncated EBG structures. To this end, not all vias of the truncated EBG structures should be interconnected, and as only the outermost vias are interconnected, the SIW waveguide may be formed in a cavity between the outermost vias. Such a SIW waveguide is, for example, shown in general in FIG. 3 and is shown in more detail in FIGS. 23A, 23B, 23C, 23D and 23E. The conductive parts forming the cells of the EBG structure may be electrically connected to each other in the conductive layers of the printed circuit board, such that the upper and lower bases of the SIW waveguide may be formed and the conductive parts may not be electrically connected to each other in the outermost conductive layers of the printed circuit board. For example, such antenna is a part of the printed circuit board (e.g., the printed circuit boards 130 and 131 of FIGS. 2 through 4), and the EBG structure forming the SIW waveguide serves here as an isolator of the backward radiation. Highly efficient radiation in a designated direction in the wireless channel is provided, and no external parts, except for the printed circuit board itself, which comprises all the elements at once, are not required.

A simulation of the arrangement of the device was performed, in which the EBG structures forming the SIW waveguide are arranged between the bases (e.g., the conductive plates 111 and 112), and the antenna 120 or 121 is placed between the bases and the EBG structures (e.g., the side walls), the antenna in turn comprises a SIW waveguide formed between the truncated EBG structures.

Figure 24:
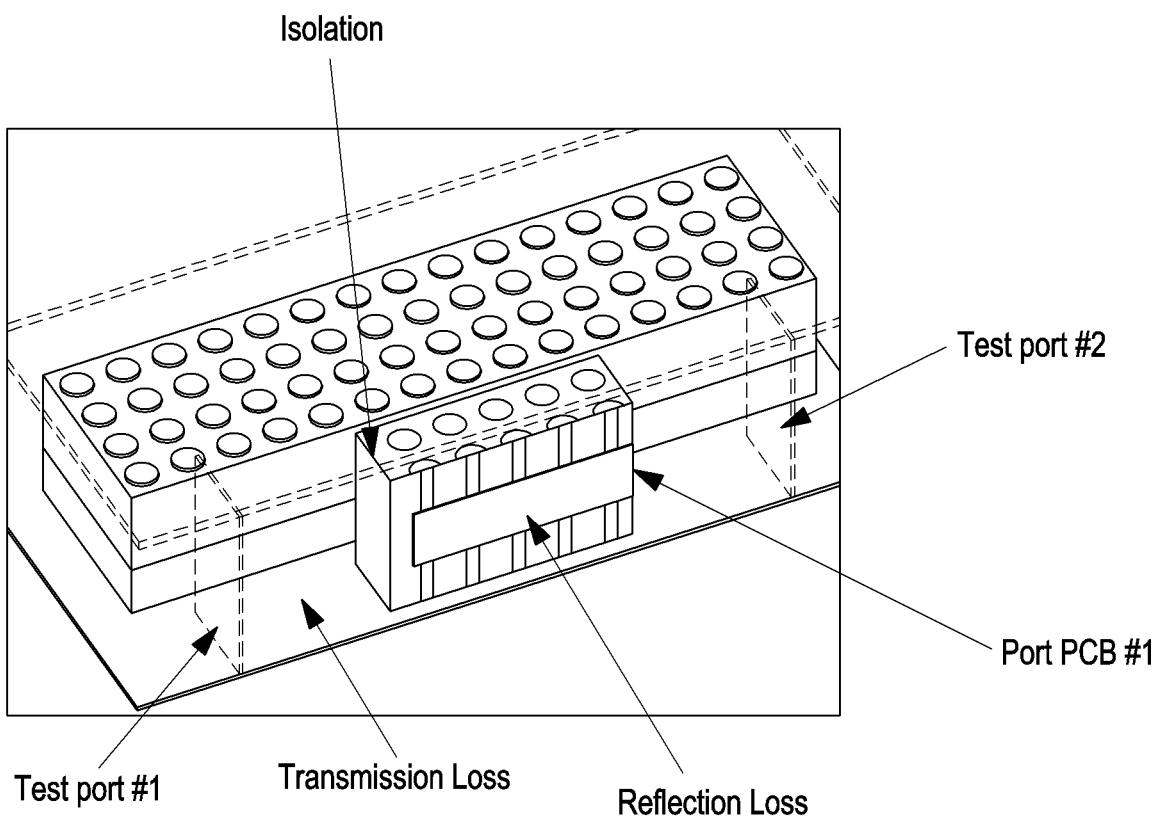
FIG. 24 is a diagram illustrating test equipment for simulating an antenna based on a SIW waveguide enclosed in truncated EBG structures according to various embodiments.
Figure 25:
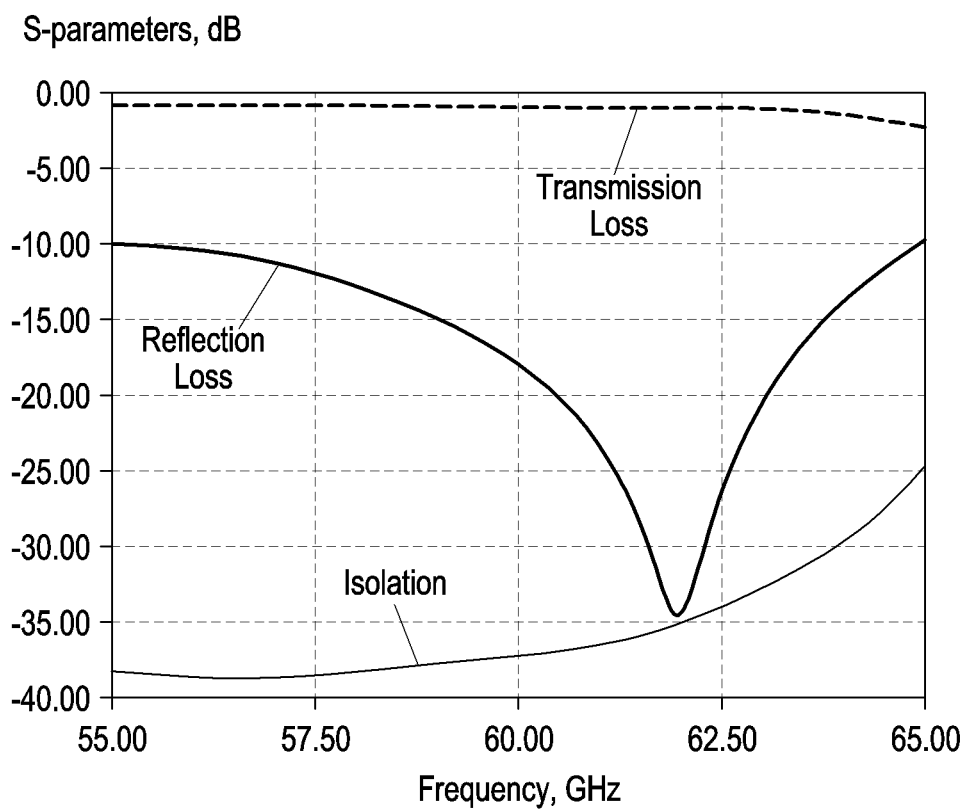
FIG. 25 is a graph illustrating simulation results for the case of FIG. 24 according to various embodiments.

A schematic representation of the test equipment is shown in FIG. 24 with explanations in the form of arrows how the transmitted wave, the reflected wave propagates, and how leakage can occur. The simulation graph is shown in FIG. 25. For example, the following S-parameters were obtained: the transmission loss coefficient in the operating frequency band was about −1 dB, the return loss coefficient was about −21 dB, the isolation was about −37 dB. As can be seen, the signal is transmitted with minimal loss from the antenna to the wireless channel, that is, without high reflection and leakage losses, while the antenna matching is not degraded, that is, the EBG structures integrated into the antenna made it possible to further reduce the leakage. The losses are reduced to about 20% of the radiated power. Accordingly, the device allows concentrating of the electromagnetic field in the wireless channel between the antennas, radiation isolation occurs strictly in a predetermined direction, and improving of energy efficiency is achieved.

Figure 26:
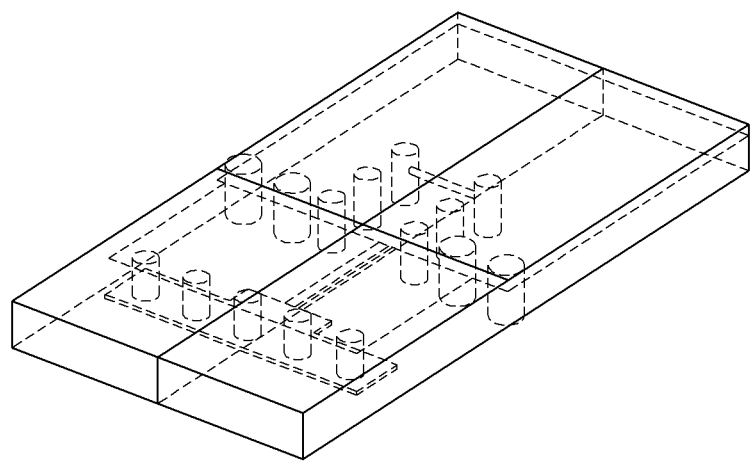
FIG. 26 is a diagram illustrating an example of a folded patch antenna according to various embodiments.
Figure 27:
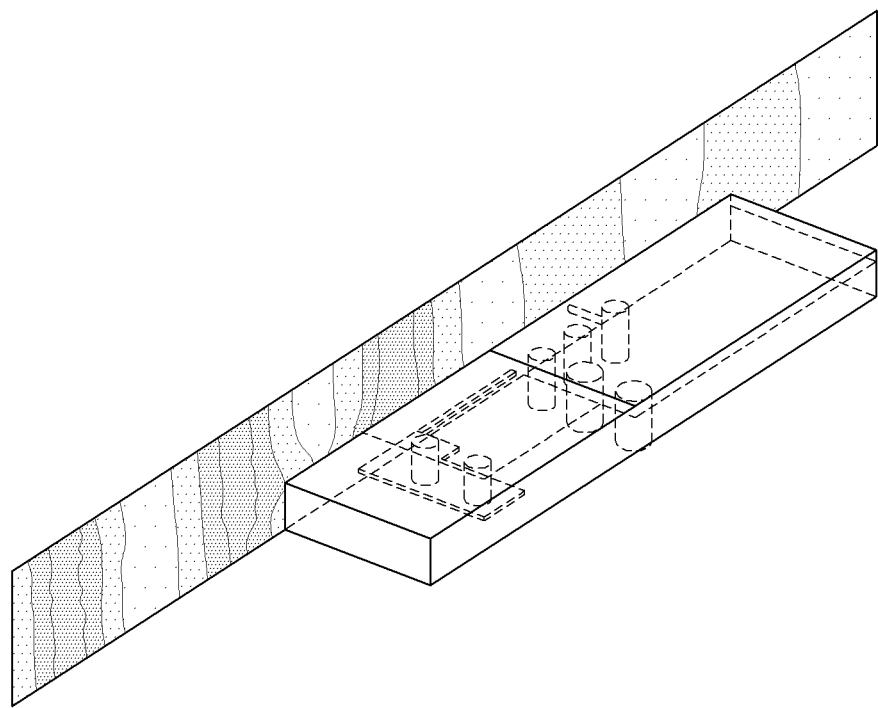
FIG. 27 is a diagram illustrating a radiation pattern for the case with a folded patch antenna according to various embodiments.
Figure 28:
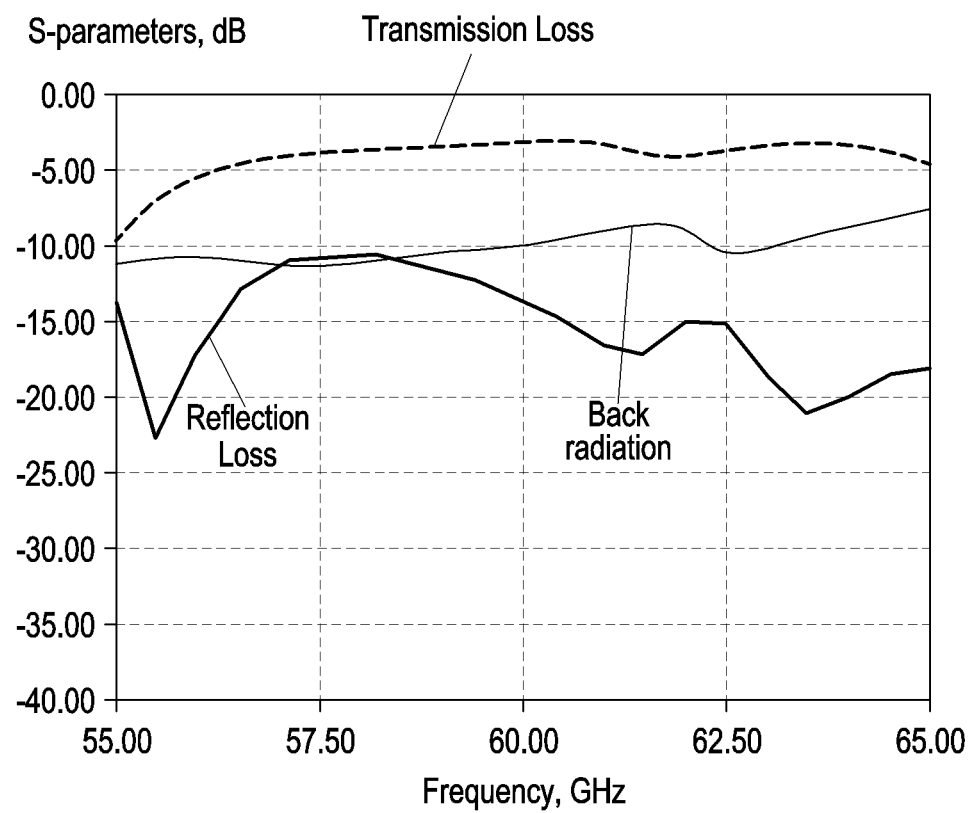
FIG. 28 is a graph illustrating simulation results for the case with a folded patch antenna according to various embodiments.

As indicated above, other antenna implementations are possible. For example, the antenna may comprise a folded patch antenna integrated into a printed circuit board and fed by a microstrip waveguide (FIG. 26). The radiation pattern of such antenna is shown in FIG. 27, and the S-parameter graph is in FIG. 28.

Figure 29:
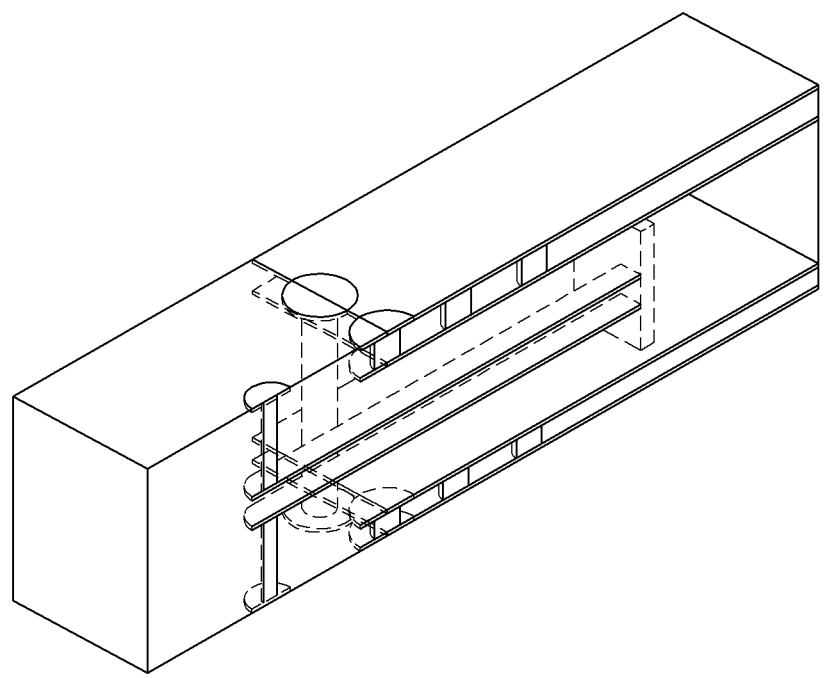
FIG. 29 is a diagram illustrating an example of a dipole antenna according to various embodiments.
Figure 30:
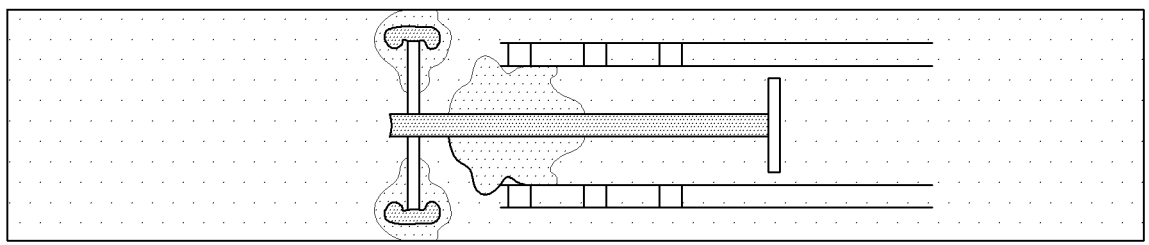
FIG. 30 is a diagram illustrating a radiation pattern for the case with a dipole antenna according to various embodiments.
Figure 31:
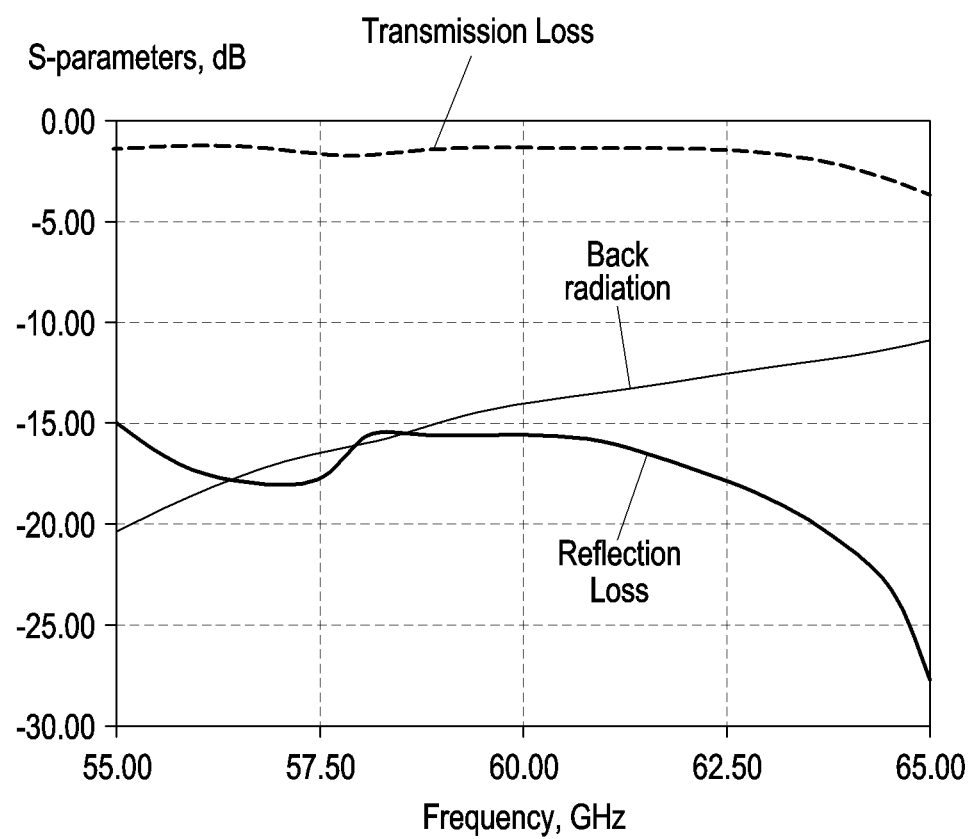
FIG. 31 is a graph illustrating simulation results for the case with a dipole antenna according to various embodiments.

In an embodiment, the antenna may comprise a dipole antenna integrated into a printed circuit board, located at the edge of the printed circuit board (FIG. 29). The radiation pattern of such antenna is shown in FIG. 30, and the S-parameter graph is in FIG. 31.

Figure 32:
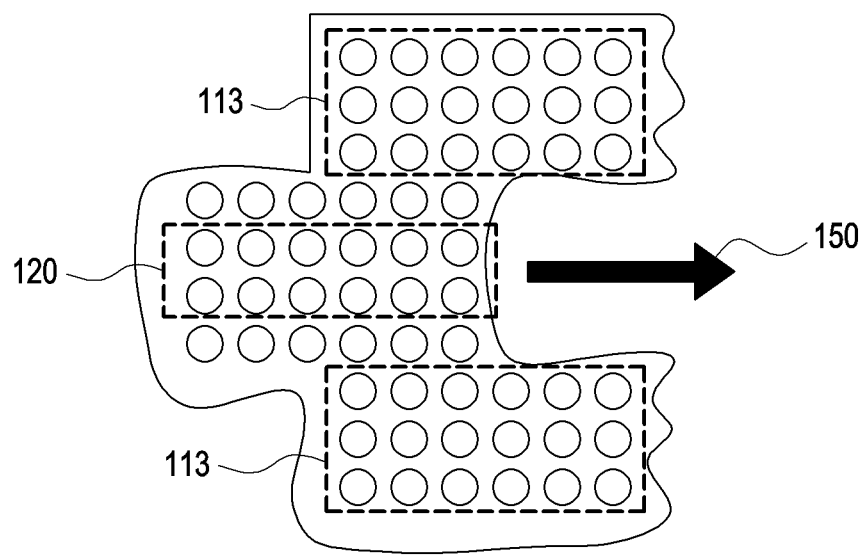
FIG. 32 is a diagram illustrating an example of integrating an antenna and side walls into a single printed circuit board according to various embodiments.

An embodiment is also possible, in which the first antenna 120 and at least part (for example, half) of the EBG structures 113 of the waveguide side walls form a single EBG structure within a single printed circuit board. Similarly, the second antenna 121 and at least part (for example, the other half) of the EBG structures 113 of the waveguide side walls can be embedded in a single printed circuit board. In another embodiment, as shown in FIG. 32, the antenna, together with both side walls (e.g., the EBG structures 113), are entirely integrated into one printed circuit board, and the other antenna is docked to this structure to form a wireless channel. In such cases, manufacturing of the device is further simplified.

In the foregoing, examples were described in which the antennas are located in the waveguide such that the radiation axis is parallel to the bases. However, various embodiments are also possible in which the antennas are positioned in the waveguide such that the radiation axis is perpendicular to the bases.

For example, the antennas 120 and 121 can be stacked on each other, for example, in different modules, as shown in FIGS. 33, 34, 35, 36A and 36B.

Figure 33:
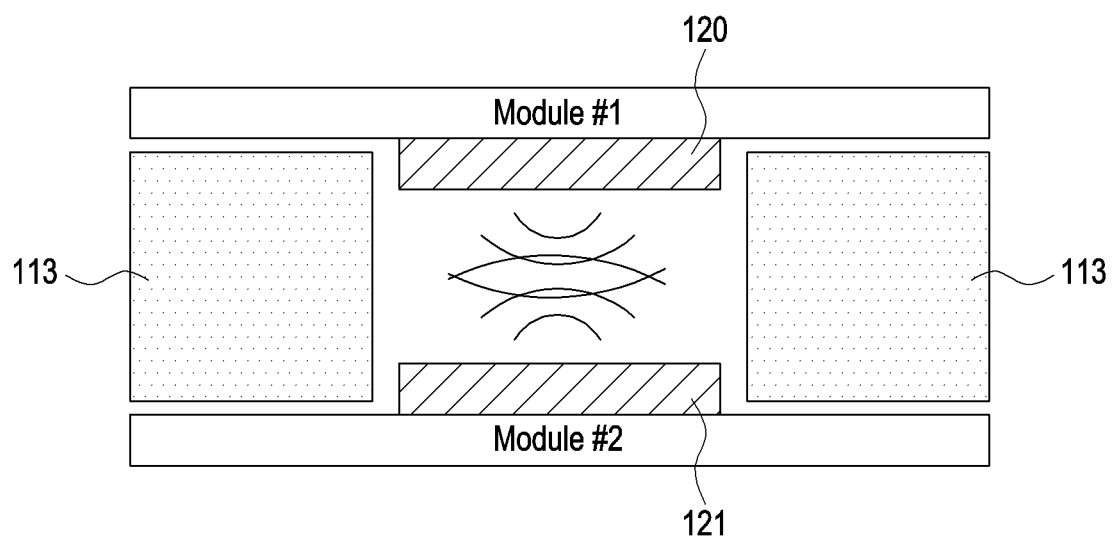
FIGS. 33, 34, 35, 36A and 36B are diagrams illustrating signal transmission perpendicular to the plane of the bases according to various embodiments.

In this case, the resonant structures (EBG structures 113) limiting the radiation, can be separate elements and can be located at the edges of the antennas between two modules with an air gap between the EBG structures and the bases (FIG. 33).

Figure 34:
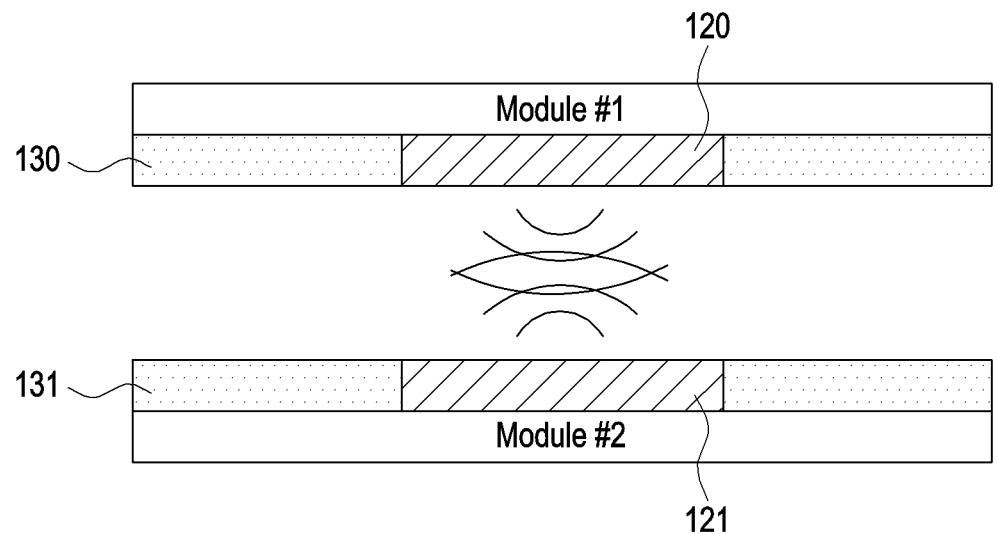

In an embodiment, the EBG structures 113 may be integrated into the same printed circuit boards 130 and 131 in which the antennas 120 and 121 are implemented, and cover these antennas, and the distance between the EBG structures is such as to ensure transmission and prevent and/or restrict leakage (FIG. 34).

Figure 35:
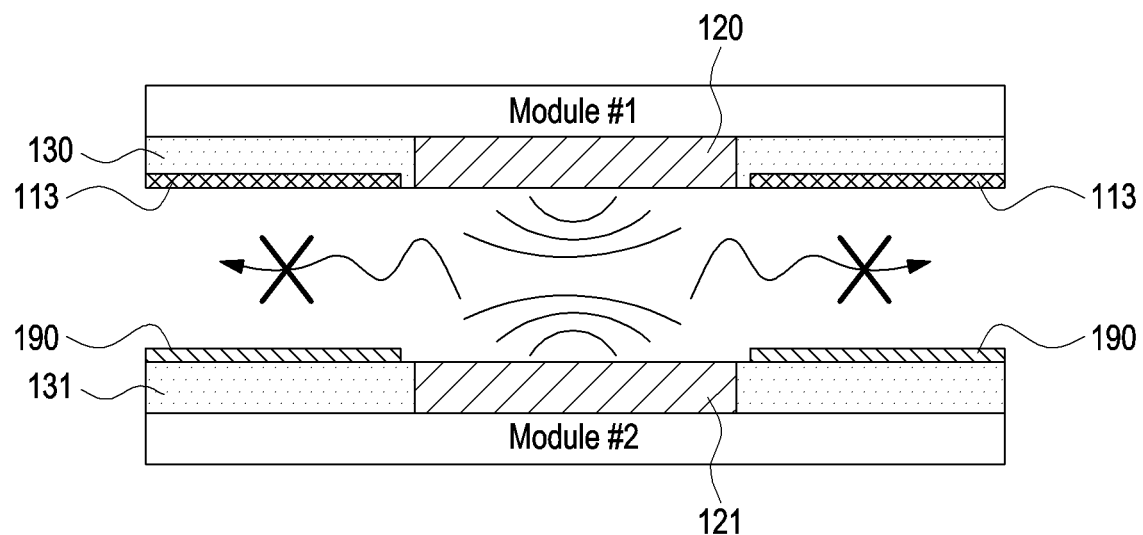

In an embodiment, the EBG structures 113 may be integrated into the same printed circuit boards 130 and 131 in which the antennas 120 and 121 are implemented, and cover these antennas. The second module may be covered with ground layer 190, which serves as one of the bases for the EBG structure of the first module, and the distance between the EBG structure of the first module and the outer ground layer of the second module is such as to ensure transmission and prevent and/or restrict leakage (FIG. 35).

Figure 36A:
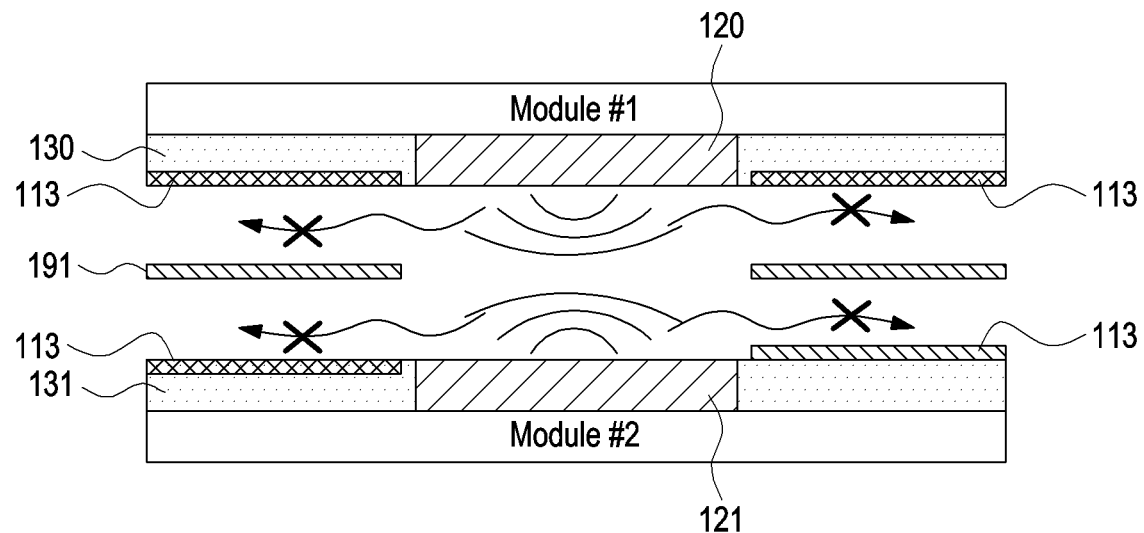
Figure 36B:
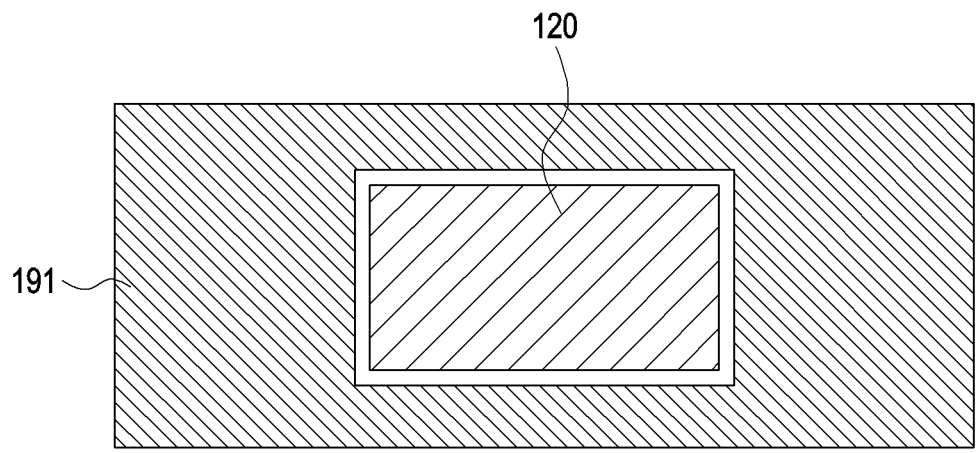

In an embodiment, the EBG structures 113 may be integrated into the same printed circuit boards 130 and 131 in which the antennas 120 and 121 are implemented, and cover these antennas. Between the EBG structures, there is additionally an intermediate conductive plate 191 comprising a cutout in the area of the wireless channel (FIGS. 36A and 36B).

Figure 37:
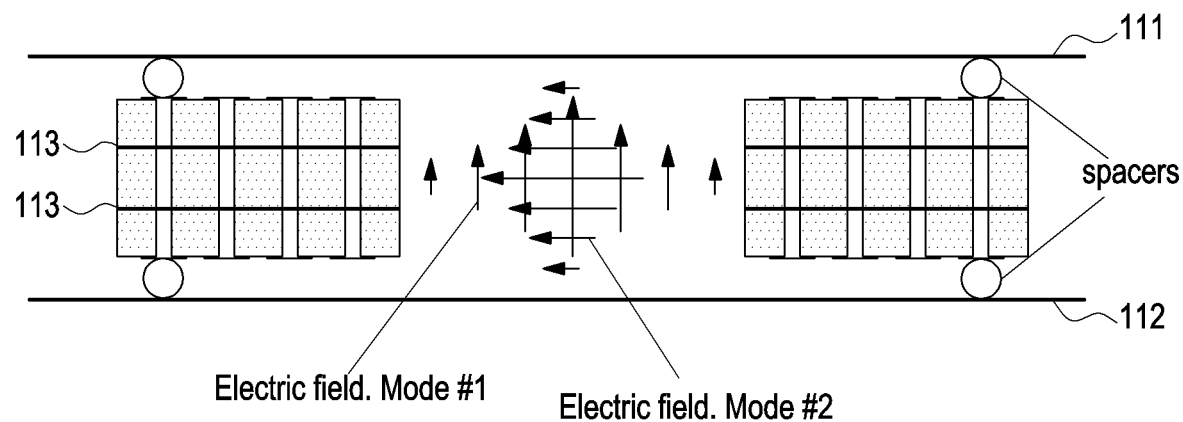
FIG. 37 is a diagram illustrating signaling in full duplex mode according to various embodiments.

The foregoing examples were described in which one type of wave is transmitted over the wireless channel. However, the device of the disclosure is so versatile that it allows two types of waves to be transmitted and received via the wireless channel, which are perpendicular to each other (FIG. 37). The distance between the bases of the waveguide should be sufficient for the propagation of additional modes. High isolation between modes is provided that allows transmitting and receiving data simultaneously, e.g. in duplex mode.

As indicated above, the size, shape and location of the conductive portions of EBG cells may be selected according to the requirements of a particular application. Conductive portions of EBG cells can be made as an octagon, square, circle, triangle, etc. The conductive portions do not need to be centered with the via and can be offset. The principles of sizing an electromagnetic crystal structure with a band gap will be apparent to those skilled in the art. The structure should be periodic. The lattice, e.g., the EBG cells may form 2D periodic arrangement, and when connected by a virtual line, a square, a rectangle, a triangle, etc., may be formed by intersection between virtual lines. Thus, the flexibility of arranging cells, and the simple adaptation of the waveguide to the internal structures of the device in which it should be used, as well as the convenient adjustment of the required electrical characteristics are provided.

Figure 38:
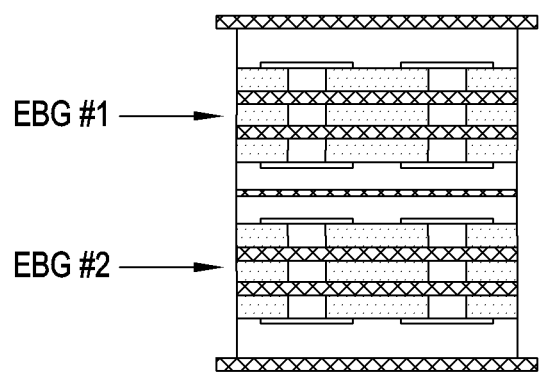
FIG. 38 is a diagram illustrating an example multilayer EBG structure according to various embodiments.

If necessary, any of the EBG structures disclosed in the disclosure can be layered on top of each other. In this case, they can be separated by an intermediate ground layer (FIG. 38). For example, the side walls may include the stacked EBG structure(s) with an intermediate ground layer therebetween. The intermediate ground layer may not contact the conductive part of the stacked EBG structure(s).

The signal transmission device according to the disclosure provides many advantages over the prior art. For example, it provides a wireless channel with improved energy efficiency, reduced RF power leakage, and simplified assembling and manufacturing. The data transmission speed may increase to a maximum of 2 Gbps or more. As can be seen from an experiment result, data may be transmitted at 2.3 Gbps without serious jitter. The geometry of the device is more resistant to mechanical distortion. No external shielding required. The minimum distance between the PCBs is reduced to less than 1 mm. The increased reliability of contacts and lower tolerance requirements are provided using contactless mechanics. The beam control is not required. Furthermore, the disclosure provides a simplified integration with PCB technologies, widening of the operating bandwidth, increased compactness and possibility of varying the device sizes, there is no need galvanic connection between device elements. The device is scalable, compact and broadband and has low losses and may successfully be used for applications in the millimeter-wave and subTHz bands.

It should be appreciated that the principle of construction and basic examples of the RF signal transmission device are shown herein. A person skilled in the art using these principles will be able to obtain various other embodiments.

The signal transmission device according to the disclosure can be used in electronic devices that require RF signal transmission over a short distance, for example, in the millimeter-wave band for mobile networks 5G (28 GHz), WiGig (60 GHz), Beyond 5G (60 GHz), 6G (subTHz), for automotive radar systems (24 GHz, 79 GHz), for short-range communications (60 GHz), for smart home systems and other millimeter-wave adaptive intelligent systems, for car navigation, for the Internet of things (IoT), wireless charging, etc.

It should be appreciated that although herein such terms as "first", "second", "third", etc. may be used to describe various elements, components, regions, layers and/or sections, these elements, components, regions, layers and/or sections should not be limited by these terms. These terms are simply used to distinguish one element, component, region, layer or section from another element, component, region, layer or section. So, the first element, component, region, layer or section may be termed a second element, component, region, layer or section without going beyond the scope of the disclosure. In the disclosure, the term "and/or" includes any and all combinations of one or more of the respective listed items. The elements referred to in the singular do not exclude a plurality of elements, unless otherwise specified.

Functionality of the element specified in the description or the claims as a single element can be implemented in practice through several components of the device, and vice versa, functionality of the elements specified in the description or claims as multiple separate elements can be implemented in practice by a single component.

In an embodiment, the elements/units of the present device are disposed in a common housing, placed on the same frame/structure/printed circuit board and connected to each other structurally by mounting (assembly) operations and functionally via communication lines. The communication lines or channels, unless specified otherwise, are conventional communication lines, the material implementation of which does not require creative effort. Communication line may include, for example, a wire, set of wires, bus, path, wireless communication link (inductive, radio frequency, infrared, ultrasonic, etc.). Communication protocols over the communications links are known in the art and not disclosed separately.

Functional relationship of elements should be understood as a connection providing correct cooperation of these elements with each other and implementing a particular functionality of elements. Examples of functional relationship may be a connection providing exchange of information, a connection providing transmission of electric current, a connection providing transfer of mechanical motion, a connection providing transmission of light, sound, electromagnetic or mechanical vibrations, etc. The specific form of functional relationship is determined by the nature of interaction of the elements, and, unless otherwise specified, is provided by well-known means using the principles well-known in the art.

Elements of the device can be made of any suitable material. These components can be manufactured using known methods, including, merely by way of example, machining and lost-wax casting. Assembly, connection and other operations in accordance with the above description also correspond to the knowledge of the person skilled in the art and, thus will not be explained in greater detail here.

Although various example embodiments have been described in detail and shown in the accompanying drawings, it should be understood that such embodiments are merely illustrative and are not intended to limit the disclosure and that the disclosure should not be restricted to the specific shown and described arrangements and constructions, since various other modifications and embodiments of the disclosure, will be apparent to those skilled in the art based on the information contained in the description.

As described above, according to various example embodiments, a device (e.g., the device 100 of FIGS. 2 through 4) configured to transmit signals (e.g., the electromagnetic signal or high frequency signal 150 of FIGS. 2 through 4) may include: a first conductive base and a second conductive base (e.g., the conductive plates 111 and 112 of FIGS. 2 through 4) parallel to each other, a waveguide (e.g., the waveguide 110 of FIG. 3 or 4) at least partially surrounded by side walls located between the first conductive base and the second conductive base and including at least one electromagnetic band gap (EBG) structure (e.g., the EBG structure 113 of FIGS. 2 through 4), and at least two directional antennas (e.g., the antennas 120 and 121 of FIGS. 2 through 4) opposite to or facing each other in a direction (e.g., as a radiation axis, in a direction in which the signal 150 of FIGS. 2 through 4 is transmitted) in which signals are to be transmitted, wherein each antenna is based on a printed circuit board and includes an EBG structure (e.g., the EBG structure of FIGS. 23A through 23E) located on an upper layer and a lower layer of the printed circuit board and configured to prevent and/or restrict back radiation and at least one matching element (e.g., the matching elements 180 and 181 of FIG. 6), at least a part of each of the antennas is located inside the waveguide to provide a wireless channel (e.g., the wireless channel 140 of FIGS. 2 through 4) configured to transmit electromagnetic signals in an area between the antennas, and the at least one matching element is located within a specified distance of the wireless channel and is configured to match the antenna with the wireless channel.

According to various example embodiments, the EBG structure included in the side walls or the antenna may include a plurality of cells (e.g., see FIG. 10 or FIG. 14) located side by side to form a two-dimensional periodic lattice, and each cell may include conductive portions (e.g., the contact pads 211 of FIG. 11) that are parallel to each other within a first and second conductive layers, with a dielectric layer of the printed circuit board therebetween, a conductive element (e.g., the conductive element 213 of FIG. 11) passing through the dielectric layer and connecting the conductive portions to each other, and the conductive portions of adjacent cells within at least one of the first and second conductive layers of the printed circuit board may not be electrically interconnected.

According to various example embodiments, the EBG structure included in the side walls may be separated from at least one of the first conductive base or the second conductive base by a dielectric gap, and the device may further include spacers (e.g., see FIG. 37) located between the EBG structure included in the side walls and the first conductive base or the second conductive base in an area of the dielectric gap, wherein the spacers provide the dielectric gap while fixing the EBG structure included in the side walls and are located to not bring adjacent cells of the EBG structure included in the side walls in contact with each other.

According to various example embodiments, the spacers may be conductive, and at least three of the cells of the EBG structure included in the side walls may be arranged (e.g., see FIG. 37) between the spacers and a boundary between the EBG structure included in the side walls and the wireless channel.

According to various example embodiments, a conductive element of the cells of the EBG structure included in the side walls or the antenna may be a metallized via, and the conductive portion of the cell of the EBG structure is a contact pad.

According to various example embodiments, at least one of the antennas may include, within a multi-layer printed circuit board, at least two EBG structures and a substrate integrated waveguide (SIW) waveguide (e.g., see FIGS. 23A, 23B, 23C, 23D and 23E), formed between the at least two EBG structures, the conductive portions of adjacent cells of the EBG structure included in the antenna may be electrically connected to each other within the conductive layers of the printed circuit board to form the upper base and the lower base of the SIW waveguide, and the conductive portions of adjacent cells of the EBG structures included in the antenna may not be electrically connected to each other within outermost conductive layers of the printed circuit board.

According to various example embodiments, at least a part of the EBG structures of the side walls and at least one of the antennas may comprise a single EBG structure within a single printed circuit board.

According to various example embodiments, at least part of the waveguide and at least one of the antennas may be integrated into a single printed circuit board.

According to various example embodiments, the antennas may be configured to transmit and receive, over the wireless channel, two types of waves, which are perpendicular to each other.

According to various example embodiments, at least one of the antennas may include a folded patch antenna integrated into the printed circuit board, which is energized by a microstrip waveguide (e.g., see FIG. 26).

According to various example embodiments, at least one of the antennas may include a dipole antenna integrated into the printed circuit board (e.g., see FIG. 29 or FIG. 30).

According to various example embodiments, the antennas may be arranged in the waveguide such that a direction in which signals are transmitted is parallel to the bases.

According to various example embodiments, the antennas may be located in the waveguide such that a direction in which signals are transmitted is perpendicular to the bases.

According to various example embodiments, the first conductive base, the side walls, and any one of the antennas may be integrated into the first printed circuit board, and the second conductive base and another one of the antennas may be integrated into the second printed circuit board.

According to various example embodiments, the side walls may include at least two EBG structures and the device may further include a conductive plate (e.g., see FIG. 36A or FIG. 36B) including a slot in the area of the wireless channel, wherein the first base of the waveguide, at least one of the EBG structures side walls and at least one of the antennas are integrated into the first printed circuit board, and the second base, at least one other of the EBG side wall structures and at least one other of the antennas are integrated into the second printed circuit board.

According to various example embodiments, the side walls may further include an intermediate ground layer (e.g., see FIGS. 14 through 18), and the EBG structures may include a first EBG structure stacked on the intermediate ground layer and a second EBG structure stacked under the intermediate ground layer and separated from the first EBG structure.

According to various example embodiments, a device for transmitting signals includes: a first conductive plate and a second conductive plate parallel to each other, side walls located between the first conductive base and the second conductive base and comprising at least one electromagnetic band gap (EBG) structure, a waveguide at least partially surrounded by the first conductive plate, the second conductive plate, and the side walls, and a pair of directional antennas at least partially arranged within the waveguide and arranged opposite to or facing each other with a designated space therebetween, wherein at least one of the side walls and at least one of the directional antennas are integrated into one printed circuit board, and the directional antennas are configured to transmit and receive an electromagnetic signal to and from each other using at least a part of the waveguide.

According to various example embodiments, the device may further include a wireless channel formed between the directional antennas in the waveguide, wherein at least one of the directional antennas comprises at least one other EBG structure forming a substrate integrated waveguide (SIW) waveguide and at least one matching element located adjacent to the wireless channel.

According to various example embodiments, an EBG structure included in the side walls may be configured to form capacitive coupling with the first conductive plate or the second conductive plate.

According to various example embodiments, the directional antennas may be configured to transmit an electromagnetic signal using any one of a first mode that generates an electric field in a first direction within the waveguide and a second mode that generates an electric field in a second direction that is orthogonal to the first direction.

The disclosure provides a device that is operable in the millimeter-wave band and subTHz range, is simpler to manufacture, more compact and inexpensive, while demonstrating improved characteristics in comparison with solutions known from the prior art. Moreover, various effects recognized directly or indirectly from the disclosure may be provided.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A device configured to transmit signals, comprising:
 a first conductive base and a second conductive base parallel to each other;
 a waveguide at least partially surrounded by side walls located between the first conductive base and the second conductive base and comprising at least one electromagnetic band gap (EBG) structure; and
 at least two directional antennas opposite to or facing each other in a direction in which signals are to be transmitted,
 wherein each antenna is on a printed circuit board and comprises another EBG structure located on an upper layer and a lower layer of the printed circuit board and at least one matching element,
 at least a part of each antenna is located inside the waveguide to form a wireless channel configured to transmit electromagnetic signals in an area between the antennas, and
 the at least one matching element is located within a specified distance of the wireless channel and configured to match the antenna with the wireless channel.

2. The device according to claim 1, wherein the EBG structure included in the side walls or the antenna comprises a plurality of cells located side by side to form a two-dimensional periodic lattice, and each cell comprises: conductive portions parallel to each other within a first and second conductive layers, with a dielectric layer of the printed circuit board therebetween; and
 a conductive element passing through the dielectric layer and connecting the conductive portions to each other,
 wherein the conductive portions of adjacent cells within at least one of the first and second conductive layers of the printed circuit board are not electrically interconnected.

3. The device of claim 2, wherein the EBG structure included in the side walls is separated from at least one of the first conductive base or the second conductive base by a dielectric gap, and
 the device further comprises: spacers located between the EBG structure included in the side walls and the first conductive base or the second conductive base in an area of the dielectric gap, wherein the spacers are configured to provide the dielectric gap and fix the EBG structure included in the side walls and are located to not bring adjacent cells of the EBG structure included in the side walls in contact with each other.

4. The device of claim 3, wherein the spacers are conductive, and at least three of the cells of the EBG structure included in the side walls are arranged between the spacers and a boundary between the EBG structure included in the side walls and the wireless channel.

5. The device of claim 2, wherein a conductive element of the cells of the EBG structure included in the side walls or the antenna comprises a metallized via, and the conductive portion of the cell of the EBG structure comprises a contact pad.

6. The device of claim 2, wherein at least one antenna comprises, within a multi-layer printed circuit board, at least two EBG structures and a substrate integrated waveguide (SIW) waveguide, formed between the at least two EBG structures,
 wherein the conductive portions of adjacent cells of the EBG structure included in the antenna are electrically connected to each other within the conductive layers of the printed circuit board to form the upper base and the lower base of the SIW waveguide, and
 the conductive portions of adjacent cells of the EBG structures included in the antenna are not electrically connected to each other within outermost conductive layers of the printed circuit board.

7. The device of claim 6, wherein at least a part of the EBG structures of the side walls and at least one antenna comprise a single EBG structure within a single printed circuit board.

8. The device of claim 1, wherein at least a part of the waveguide and at least one antenna are integrated into a single printed circuit board.

9. The device of claim 1, wherein the antennas are configured to transmit and receive, over the wireless channel, two types of waves, the two types of waves being perpendicular to each other.

10. The device of claim 1, wherein at least one antenna comprises a folded patch antenna integrated into the printed circuit board, the at least one antenna configured to be energized by a microstrip waveguide.

11. The device of claim 1, wherein at least one antenna comprises a dipole antenna integrated into the printed circuit board.

12. The device of claim 1, wherein the antennas are arranged in the waveguide such that a direction in which signals are transmitted is parallel to the bases.

13. The device of claim 1, wherein the antennas are located in the waveguide such that a direction in which signals are transmitted is perpendicular to the bases.

14. The device of claim 13, wherein the first conductive base, the side walls, and any one of the antennas are integrated into the first printed circuit board, and the second conductive base and another one of the antennas are integrated into the second printed circuit board.

15. The device of claim 13, wherein the side walls comprise at least two EBG structures,
the device further comprises a conductive plate comprising a slot in a region of the wireless channel, and
the first conductive base, at least one of EBG structures of the side walls, and any one of the antennas are integrated into the first printed circuit board, and the second conductive base, at least one another of the EBG structures of the side walls, and another one of the antennas are integrated into the second printed circuit board.

16. The device of claim 13, wherein the side walls further comprise an intermediate ground layer, and the EBG structures comprise: a first EBG structure stacked on the intermediate ground layer and a second EBG structure stacked under the intermediate ground layer and separated from the first EBG structure.

17. A device configured to transmit signals, comprising:
a first conductive plate and a second conductive plate arranged parallel to each other;
side walls located between the first conductive base and the second conductive base and comprising at least one electromagnetic band gap (EBG) structure;
a waveguide at least partially surrounded by the first conductive plate, the second conductive plate, and the side walls; and
a pair of directional antennas at least partially arranged within the waveguide and arranged opposite to or facing each other with a designated space therebetween, wherein at least one of the side walls and at least one of the directional antennas are integrated into one printed circuit board, and
the directional antennas are configured to transmit and receive an electromagnetic signal to and from each other using at least a part of the waveguide.

18. The device of claim 17, further comprising a wireless channel formed between the directional antennas in the waveguide,
wherein at least one of the directional antennas comprises at least one other EBG structure forming a substrate integrated waveguide (SIW) waveguide and at least one matching element located adjacent to the wireless channel.

19. The device of claim 17, wherein an EBG structure included in the side walls is configured to form capacitive coupling with the first conductive plate or the second conductive plate.

20. The device of claim 17, wherein the directional antennas are configured to transmit an electromagnetic signal using any one of a first mode that generates an electric field in a first direction within the waveguide and a second mode that generates an electric field in a second direction orthogonal to the first direction.

* * * * *